(12) United States Patent
Kuroda

(10) Patent No.: US 6,359,301 B1
(45) Date of Patent: Mar. 19, 2002

(54) SEMICONDUCTOR DEVICE AND METHOD OF MANUFACTURING THE SAME

(75) Inventor: Hideaki Kuroda, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/103,618

(22) Filed: Jun. 24, 1998

(30) Foreign Application Priority Data

Jun. 25, 1997 (JP) .............................................. 9-168718

(51) Int. Cl.[7] .......................................... H01L 27/108
(52) U.S. Cl. ...................................... 257/306; 257/775
(58) Field of Search ................................ 257/775, 303, 257/306; 438/241, 254; 361/325

(56) References Cited

U.S. PATENT DOCUMENTS

| | | | | |
|---|---|---|---|---|
| 5,332,685 A | * | 7/1994 | Park et al. .................. | 438/254 |
| 5,383,088 A | * | 1/1995 | Chapple-Sokol et al. ... | 361/305 |
| 5,808,365 A | * | 9/1998 | Mori .......................... | 257/775 |
| 5,998,251 A | * | 12/1999 | Wu et al. ................... | 438/241 |
| 6,255,685 B1 | * | 7/2001 | Kuroda ....................... | 257/306 |

* cited by examiner

*Primary Examiner*—Long Pham
*Assistant Examiner*—William David Coleman
(74) *Attorney, Agent, or Firm*—Rader, Fishman & Grauer PLLC; Ronald P. Kananen, Esq.

(57) ABSTRACT

A semiconductor device comprising a first connecting plug for bit contact and a second connecting plug for storage node contact buried in a first inter-layer insulating layer covering the transistor and projecting from the transistor. The bit line is buried in a second inter-layer insulating layer and connected to the first connecting plug. The electrode of the storage node is partially buried in the second inter-layer insulating layer, connected on the second connecting plug, and projected above the second inter-layer insulating layer.

10 Claims, 41 Drawing Sheets

SEMICONDUCTOR DEVICE AND METHOD OF MANUFACTURING THE SAME

BACKGROUND OF THE INVENTION

1. Field of the Invention

The present invention relates to a semiconductor device such as a dynamic random access memory (DRAM) and a method of manufacturing the same, more specifically relates to a semiconductor device comprising transistors formed on a semiconductor substrate and so forth to which bit lines and storage nodes of capacitors are connected via connecting plugs and a method of manufacturing the same.

2. Description of the Related Art

FIG. 26 is a plan view of DRAM cells (four cells) of the related art.

Active regions defined by local-oxidation-of-silicon (LOCOS) regions are arranged alternately in oblique S-shapes. Word lines WL serving also as gate electrodes of selection transistors STr are arranged parallel to each other. Bit contacts BC are located in one of the impurity regions (middle portions of active regions) forming the sources or drains of the selection transistors STr. Bit lines BL connected to the selection transistors through the bit contacts BC are arranged parallel to each other intersecting the word lines WL at right angles. The other of the impurity regions (near the two end portions of the selection transistors of the active regions) are provided with node contacts NC for connection to not illustrated capacitors.

FIG. 27 is a sectional view along the line A–A' of FIG. 26, while FIG. 28 is a sectional view along the line B–B' of FIG. 28. In FIG. 28, the left side shows a memory cell area, while the right side shows the peripheral circuit area.

As will be understood from these sectional views, a bit contact BC is comprised of a connecting plug which projects up from one of the impurity regions of the selection transistor and which partially flares outward directly under the bit line BL. Further, the node contact NC also partially flares outward at the same height and connects the other of the impurity regions of the lower layer selection transistor STr and the upper layer capacitor storage node (lower electrode). In this type of DRAM, the bit line is formed in the middle of inter-layer insulating layers in which the connection plug is buried, therefore this type of DRAM is called a "capacitor-over-bit-line" (COB) type.

Next, a simple explanation will be given of the method of manufacture of a COB type DRAM of the related art by referring to FIG. 29 to FIG. 41.

First, as shown in FIG. 29, a prepared p-type silicon substrate is formed with an n-type well and p-type well and then formed with an element isolation insulating film 201 by ordinary methods. Next, a not illustrated gate insulating film is formed by the thermal oxidation method. After this, a polycrystalline silicon layer doped with impurities to make it conductive (hereinafter referred to as a "doped polycrystalline silicon layer") 301a and a tungsten silicide (WSix) layer 301b are stacked on this, then patterned to form a gate electrode 301 (including a word line WL of a selection transistor STr). Ion-implantation is then performed using this gate electrode 301 and the element isolation insulating film 201 as a mask to form on the surface of the well a lightly doped drain (LDD) which has a relatively low concentration of the impurity.

In the step shown in FIG. 30, a thin silicon oxide film 202 is formed over the entire surface for use as an etching stopper. Polycrystalline silicon is then deposited and etched back to form a side wall 302 comprised of polycrystalline silicon on the side face of the gate electrode. Ion implantation is then performed using this side wall 302 and the element isolating insulating film 201 as a self-alignment mask to form a source or drain region 102 doped in a relatively high impurity concentration.

The side wall 302 is removed, then, as shown in FIG. 31, a silicon nitride film 203 is formed over the entire surface for use as an etching stopper by low-pressure chemical vapor deposition (LP-CVD). Next, a nondoped natural silicate glass (NSG) film 204 is formed by CVD using oxidation of tetraethyloxysilane or tetraethylorthosilicate ($Si(OC_2H_5)_4$, abbreviated as TEOS) by ozone (hereinafter referred to as the "$O_3$-TEOS method"). Next, a borophosphosilicate glass (BPSG) film 205 is formed by the same $O_3$-TEOS method.

As shown in FIG. 32, the BPSG film 205 is made to reflow to flatten it, a polycrystalline silicon film 303 is deposited, then a photoresist pattern R11 is formed for forming the apertures for the bit contacts and the node contacts.

As shown in FIG. 33, the polycrystalline silicon film 303, the BPSG film 205, and the NSG film 204 are successively etched using the photoresist pattern R11 formed is used as a mask. This etching is stopped midway in the NSG film 204 to form a preparatory contact hole. A polycrystalline silicon film is deposited over the entire surface, then etched back so as to form a side wall 304 made of polycrystalline silicon on the side face of the preparatory contact hole. As a result, the diameter of the preparatory contact hole is reduced. Next, the NSG film 20 remaining underneath is etched using this side wall 304 and the polycrystalline silicon film 303 as a mask. By this, a bit contact hole BCH reaching one of the impurity regions of the selection transistor and a node contact hole NCH reaching the other of the impurity regions formed with diameters reduced to less than the limit of resolution of photolithography.

After forming the contact hole, a polycrystalline silicon film 305 is deposited to fill the contact holes BCH and NCH (FIG. 34), then the polycrystalline silicon films 305 and 303 and the side wall 304 are etched back. This etchback is performed until the surface of the polycrystalline silicon film 305 and the side wall 304 become lower than the open faces of the preparatory contact holes. By this, as seen in FIG. 35, a plurality of poly-plugs 306 flared outward at the top are formed projecting from the impurity regions of the selection transistors STr.

In the step shown in FIG. 36, the BPSG film 205 is etched back to the same height as the surface of the poly-plug 306. A silicon oxide film 207 is formed by the LP-CVD method using oxidation or thermal oxidation of TEOS by $O^2$ gas (hereinafter referred to as the "LP-TEOS method"), then a silicon nitride film 208 is formed over the entire surface by the LP-CVD method. This film is formed with a photoresist pattern R12 for forming bit contact holes.

As shown in FIG. 36, the silicon nitride film 208 and the silicon oxide film 207 are etched using the formed photoresist pattern R12 as a mask to expose the surface of the poly-plug 306.

The photoresist pattern R12 is removed, then a doped polycrystalline silicon layer 308 and a WSix layer 309 are deposited. A not illustrated photoresist pattern is formed for patterning the bit line, then this is used as a mask to etch the lower polyside film to form the bit line BL.

Next, the LP-TEOS method is used to form a thin silicon oxide film 210 and the LP-CVD method used to form by a thin silicon nitride film 211 thinly over the entire surface, then an NSG film 212 and BPSG film 213 are deposited by the O$_3$-TEOS method and the BPSG film 213 is made to reflow to flatten its surface.

In the step shown in FIG. 38, the surface of the BPSG film 213 is lightly shaved by etching as needed in order to flatten it, then a silicon nitride film 214 acting as an etching stopper at the time of formation of the capacitor is deposited over the entire surface. A polycrystalline silicon film 310 is deposited thickly on this, then a photoresist pattern R13 is formed for opening the position above the poly-plug 302 for node contact.

In the step shown in FIG. 39, first, the polycrystalline silicon film 310 is etched using the photoresist pattern R13 as a mask to form a preparatory contact hole. Next, a further polycrystalline silicon film is deposited and etched back to form a side wall 31 made of polycrystalline silicon on the side face of the preparatory contact hole to reduce the diameter of the hole. Using the formed side wall 311 and the polycrystalline silicon film 310 as a mask, the lower layer, namely the silicon nitride film 214, the BPSG film 213, the NSG film 212, the silicon nitride film 211, and the silicon oxide film 210 are successively etched to form node contact hole reaching to the flared portion of the poly-plug 306 and reduced in diameter. A polycrystalline silicon film 312 is then deposited to fill the contact hole.

Next, as shown in FIG. 40, the polycrystalline silicon films 312 and 310 and the side wall 311 are etched back to form a poly-plug 314 connecting to the flared portion of the lower poly-plug 306. Then, a polycrystalline silicon film 315 serving as the bottom wall of the node electrode is formed, then a silicon oxide film 215 serving as a sacrificial layer at the time of formation of a cylinder type capacitor is deposited thickly on this. This silicon oxide film 215 is formed with a photoresist pattern R14 for defining the inner shape of the cylinder type capacitor.

In the step shown in FIG. 41, first, anisotropic etching is carried out by using the photoresist pattern R14 as a mask to pattern the sacrificial layer made of the silicon oxide film 215. Next, the lower polycrystalline silicon film 315 is patterned to divide into the capacitors. The photoresist pattern R14 is removed, then a polycrystalline silicon film is deposited and etched back to form a side wall 316 made of polycrystalline silicon at the surrounding wall of the sacrificial layer. The sacrificial layer is removed in this state by wet etching, whereby a cylinder type node electrode is obtained.

After this, a ONO film (three-layer film comprising a silicon oxide film sandwiched between two silicon nitride films) 216 is formed to cover the surface the node electrode, then a polycrystalline silicon film 317 is deposited for the plate electrodes. This polycrystalline silicon layer 317 and the underlayer ONO film 216 and silicon nitride film 214 are patterned to a specific shape to form the plate electrode to complete the cylinder type capacitor CAP.

After this, shown in FIG. 28, an inter-layer insulating film 217 is deposited thickly to cover the capacitor, then the surface of the inter-layer insulating film 217 is flattened and contact holes are formed for connecting the plate electrode and the peripheral circuits to the upper interconnection layer. A Ti/TiN film 318 is formed as a closely adhering layer covering the inner walls of the contact holes, then tungsten is deposited to fill the contact holes and etched back with the Ti/TiN film 318 to obtain a tungsten plug 319. After this, an aluminum interconnection layer with barrier metal at the upper and the lower sides is formed over the entire surface and patterned to a specific pattern to obtain the COB type DRAM having the cross-sectional structure shown in FIG. 28.

In the manufacturing process of a COB type DRAM of the related art, a total of five photomasks are required from the formation of the word lines to the formation of the electrodes of the storage node of the capacitor, that is, one for the formation of the first contact holes (formed at the same time as the bit contact holes and node contact holes, FIG. 32), one for the formation of openings for the poly-plug for the bit contacts (FIG. 36), one for the formation of the bit lines (FIG. 37), one for the formation of the second contact holes (upward extension of node contacts, FIG. 38), and one for the formation of the node electrodes (FIG. 40). Additionally, in a COB type DRAM cell of the related art, the inter-layer insulating films between the word lines WL and the bit lines BL and between the bit lines BL and the capacitors is relatively thick, the structure of the stacked films is complex, and the process for forming the inter-layer insulating films, including the flattening step, and for forming the contacts with the upper interconnection layers is long and leads to an increase of costs.

Further, in a COB type DRAM cell of the related art, the inter-layer insulating films are made relatively thick, so the memory cell array portion becomes about 1 $\mu$m in height. Further, the inter-layer insulating films of the peripheral circuits become thick and the aspect ratio of the contacts become large, so there is the disadvantage that the contacts of the peripheral circuits cannot be made smaller in diameter and the degree of integration cannot be raised.

SUMMARY OF THE INVENTION

The present invention was made in consideration with these circumstances. An object of the present invention is to provide a semiconductor device such as a COB type DRAM capable of being easier to manufacture with simplified steps and facilitating improvement of the degree of integration and a method of manufacturing of the same.

To solve the problems of the related art and achieve the above object, according to a semiconductor device and manufacturing method of the present invention, the bit lines are buried in the upper portion of a first inter-layer insulating layer or in a second one, so the total thickness of these inter-layer insulating layers up to the formation of the capacitors can be kept down and simultaneous formation of the contacts becomes possible and therefore the heights of the bit contacts and node contacts are made uniform. Generally, in a COB type DRAM, the electrodes of the storage nodes of the capacitors are formed a layer above the bit lines, so it is difficult to make the heights of the contacts uniform while connecting the electrodes of the storage nodes and the bit lines. This difficulty, however, is reduced by the two methods of the present invention. First, while the bit lines are formed on the first inter-layer insulating layer, the electrodes of the storage node extend partially to the lower layer, thereby enabling connection with the bit contacts. Second, the upper portions of the bit contacts are flared outward and filled with a conductive material to form the bit lines.

According to a first aspect of the present invention, there is provided a method of manufacturing a semiconductor device comprising the steps of forming a first inter-layer insulating layer on a transistor formed on a semiconductor layer, simultaneously forming a first connecting plug for bit contact and a second connecting plug for storage node contact in a manner connecting with the transistor and buried in the first inter-layer insulating layer, forming a second inter-layer insulating layer over the entire surface, forming a bit line in a manner in contact with the first connecting plug and buried in the second inter-layer insulating layer, etching off a part of the second inter-layer insulating layer for forming a capacitor to expose the top face of the second connecting plug, and forming the electrode of the storage node from the exposed top face of the second connecting plug to the upper layer side of the bit line.

Further, a concrete, preferred method of forming the electrode of the storage node comprises, after the step of forming the bit line, forming a sacrificial layer over the entire surface, forming an etching masking layer on the sacrificial layer, etching off the etching masking layer and a part of the sacrificial layer for forming a capacitor, forming a conductive side wall inside an inner wall of the part etching off, etching the second inter-layer insulating layer using the conductive side wall and the etching masking layer as etching masks to expose the top face of the second connecting plug, forming a conductive layer to connect the conductive side wall with the second connecting plug, patterning the outline of the conductive layer, and removing the sacrificial layer to form the electrode of the storage node.

Further, a preferred method of reducing the size of the first and second connecting plugs from the patterns of the photomask comprises, after the step of forming the first inter-layer insulating layer over the entire surface, forming an etching masking layer on the first inter-layer insulating layer, forming a preparatory contact hole in the etching masking layer, forming a side wall at an inner face of the preparatory contact hole to reduce the diameter thereof, simultaneously forming a bit contact hole and node contact hole by etching the second inter-layer insulating layer exposed through the reduced preparatory contact hole using the side wall and the etching masking layer as etching masks, filling a conductive material into the bit contact hole and the node contact hole, and simultaneously forming the first and second connecting plugs by etching back the conductive layer, the etching masking layer, and the side wall.

Further, a preferred method of forming the bit line so as to make it narrower comprises forming a bit line groove penetrating through the second inter-layer insulating layer, forming an insulating side wall at an inner face of the bit line groove, and filling a conductive material into the groove reduced in width by the insulating side wall.

In the above case, a preferred method of filling the conductive material comprises forming a metal silicide film in the groove formed in the second inter-layer insulating layer in contact with the inner face thereof and forming a conductive silicon layer to bury the recess formed by the metal silicide film.

Further, a preferred method of forming the second inter-layer insulating layer comprises forming a lower layer for burying the bit line and forming an upper layer having an etching rate lower than that of the lower layer. This upper layer functions as an insulating layer when the bit line and the storage node are close to each other or overlap when viewed from the top. Not only this, but the upper layer functions as an etching stopper when example the selective etching ratio between the second inter-layer insulating layer and the layer formed thereon as the sacrificial layer are the same or smaller.

According to the first aspect of the present invention explained above, there are two inter-layer insulating layers, the same as the related art. In the present invention, however, the bit line is formed buried in the second inter-layer insulating layer, so the flattening step can be omitted. Accordingly, the second inter-layer insulating film can be made relatively thin and the stacked layer structure is simple. Further, the connecting plugs for bit contact and storage node contact are formed to almost the same height on the top of the first inter-layer insulating layer, so simultaneous formation is possible. Accordingly, four photomasks are used after the step of forming the transistor to the step of forming the electrode of the storage node, that is, one for forming the contacts (simultaneously forming the bit contact and storage node contact), one for forming the bit line, one for exposing the top face of the connecting plug for node contact, and one for forming the storage node contact.

According to a second aspect of the present invention, there is provided a method of manufacturing a semiconductor device comprising the steps of forming an inter-layer insulating layer on a transistor formed on a semiconductor layer, forming a groove in the surface of the inter-layer insulating layer to a predetermined depth for defining the contours of a bit line, simultaneously forming a bit contact hole extending from the bottom face of the groove to the transistor and a node contact hole extending from the top face of the inter-layer insulating layer to the transistor, forming a conductive layer burying the bit contact hole, the node contact hole, and the groove, etching back the conductive layer and the inter-layer insulating layer to form a first connecting plug for bit contact, a second connecting plug for node contact, and the bit line buried in the inter-layer insulating layer, and forming an electrode of the storage node of a capacitor on the second connecting plug.

In above second aspect of the present invention, a preferred method of reducing the size of the first and second connecting plugs from the patterns of the photomask comprises, after the step of etching back to form the bit contact hole and the node contact hole, forming an etching stopping film to cover the surface of the inter-layer insulating layer and a conductive film to bury the groove, patterning the conductive film and the etching stopping film to form preparatory contact holes exposing a part of the top face of the inter-layer insulating layer and an inner bottom portion of the groove, forming conductive side walls at the inner faces of the preparatory contact holes to reduce the diameters thereof, and etching the inter-layer insulating layer using the conductive side walls and the conductive layer as masks at least until the time of exposing the transistor.

In the above case, a more preferred method of filling the conductive material comprises forming a metal silicide film in contact with the inner face of the groove for defining the contours of the bit line and forming a conductive silicon layer to fill the space between the metal silicide film and first connecting plug.

Further, a preferred method of forming the inter-layer insulating layer comprises forming an upper layer for burying the bit line and forming a lower layer having an etching rate lower than that of the upper layer. This lower layer functions as an etching stopper at the time of forming the groove for forming the bit line.

According to the second aspect of the present invention explained above, there is one less inter-layer insulating layer than in the related art, the stacked layer structure is simpler, and, further, in the same way as the first aspect of the present invention, the connecting plugs for bit contact and for node contact can be simultaneously formed, therefore only four photomasks are used after the step of forming the transistor to the step of forming the electrode of the storage node.

BRIEF DESCRIPTION OF THE DRAWINGS

These and other objects and features of the present invention will become clearer from the following description of the preferred embodiments given with reference to the attached drawings, in which.

DESCRIPTION OF THE PREFERRED EMBODIMENTS

Figure 1:
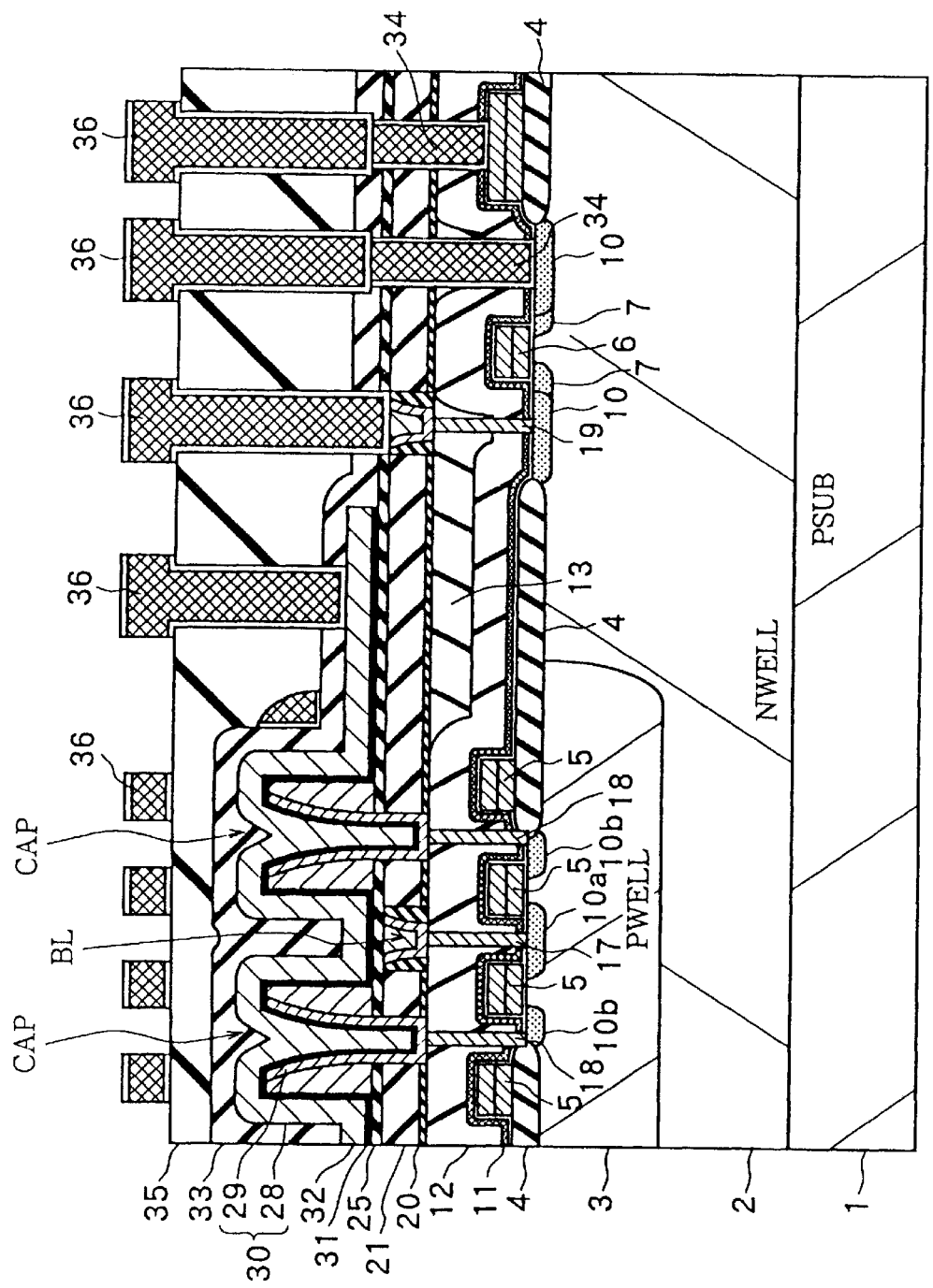
FIG. 1 is a sectional view of the configuration of a COB type DRAM according to a first embodiment of the present invention.

The present invention is preferably applied to a COB type semiconductor memory device having a memory cell comprising a transistor and capacitor connected serially to a bit line where the capacitor is located mostly at the upper layer side of the bit line. Accordingly, the present invention can be applied to for example a ferroelectric random access memory (FRAM) in addition to a DRAM.

Below, a detailed explanation will be given of embodiments of the present invention referring to the drawings and the case of a COB type DRAM.

The COB type DRAM of the embodiments of the present invention has the same planar structure as the related art. The plan view of FIG. 26 is utilized as it is.

Namely, active regions defined by LOCOS areas are arranged alternately in oblique S-shapes. Word lines WL serving also as gate electrodes of selection transistors STr and bit lines BL are arranged parallel to each other. The bit lines are connected through bit contacts BC with one of the impurity regions (middle portions of active regions) forming the sources and drains of the selection transistors. Further, the other of the impurity regions (near the two ends of the active regions) are provided with node contacts for connecting the impurity regions with not illustrated capacitors.

Figure 26:
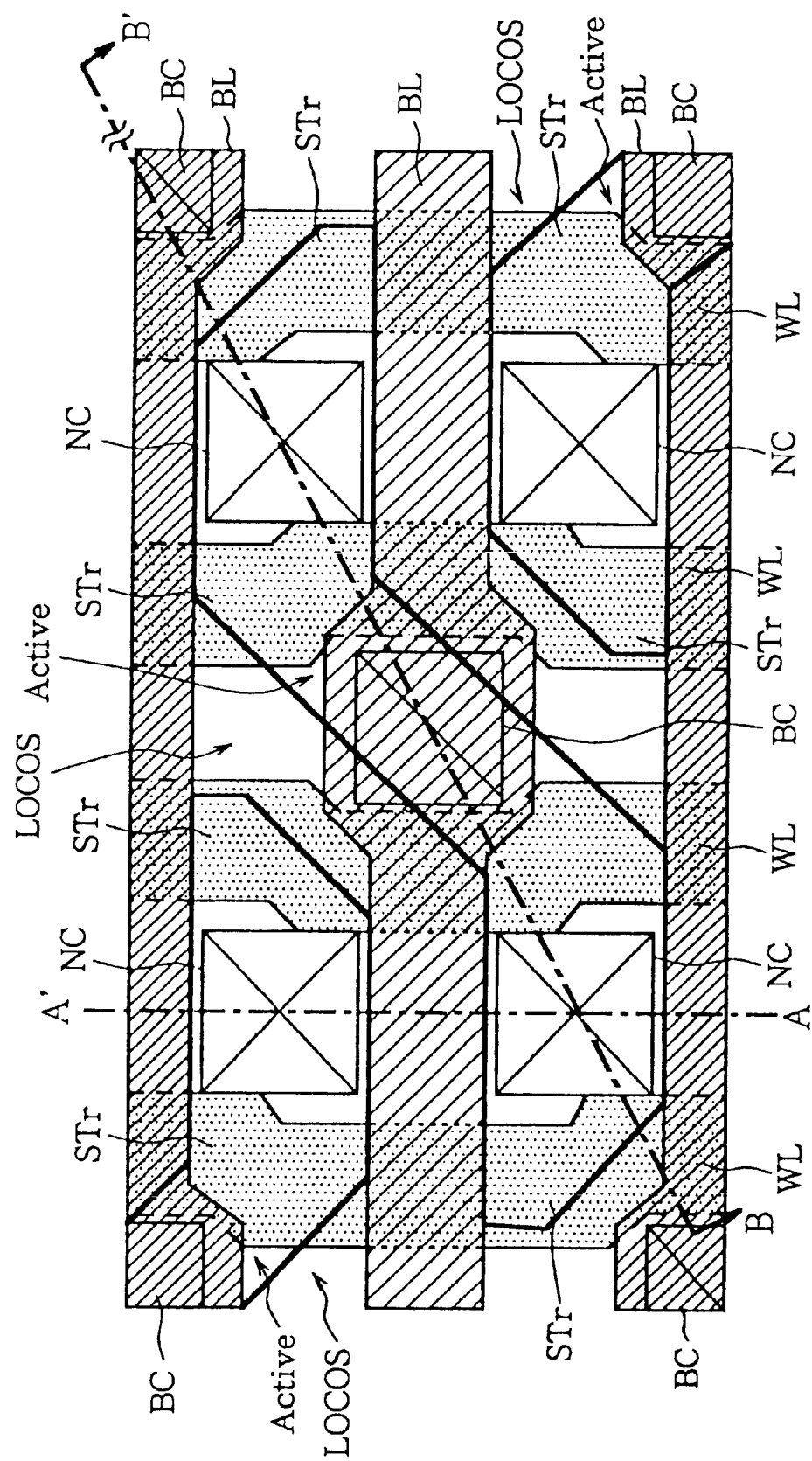
FIG. 26 is a plan view of the configuration of a COB type DRAM memory cell according to the embodiments of the present invention in common with the related art.
Figure 27:
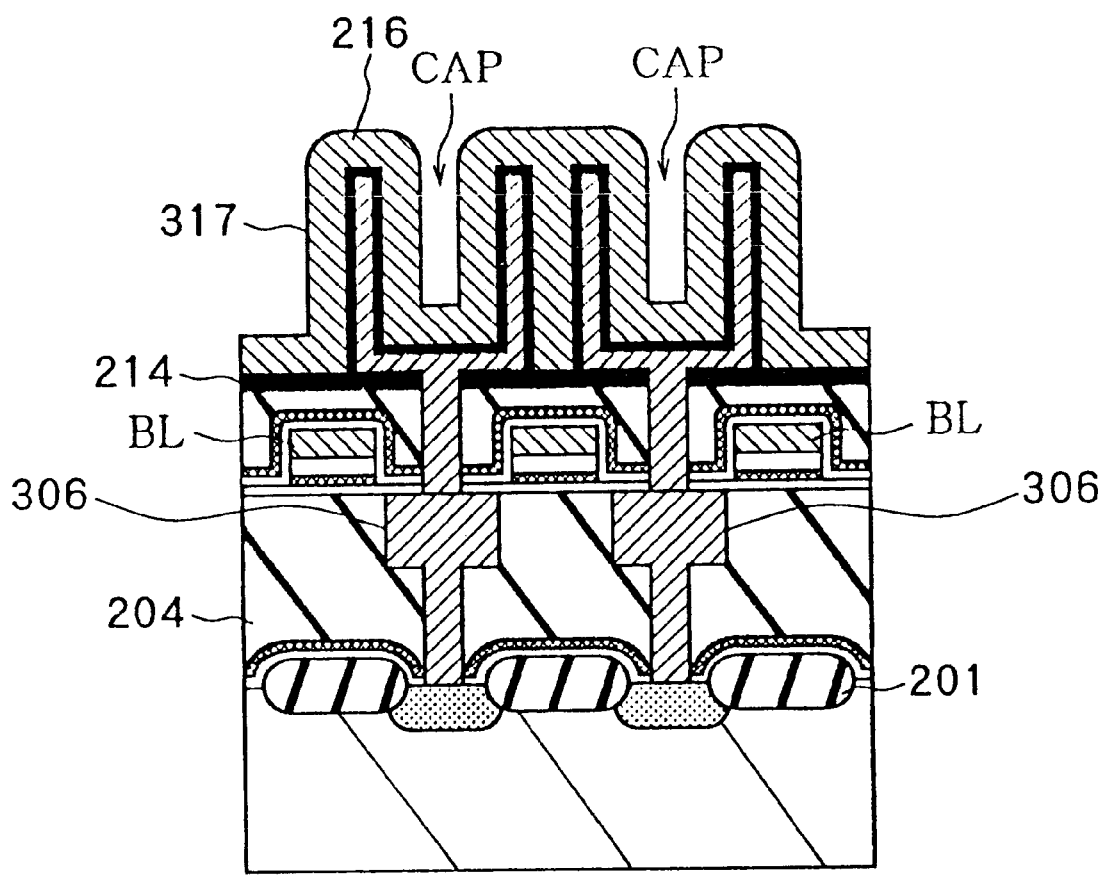
FIG. 27 is a sectional view of the memory cell of the related art taken along a line A–A' of FIG. 26.
Figure 28:
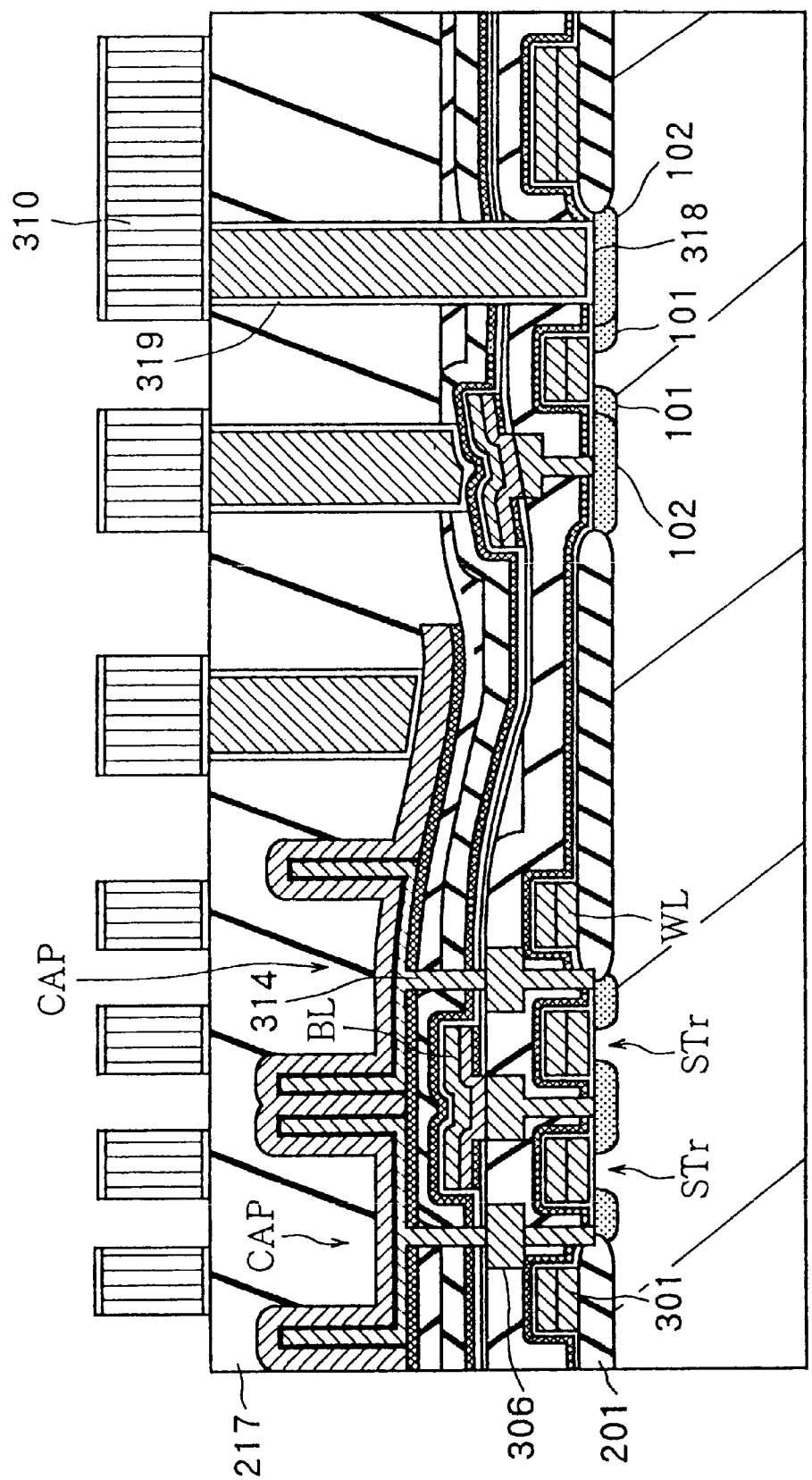
FIG. 28 is a sectional view of the memory cell of the related art taken along a line B–B' of FIG. 26.
Figure 29:
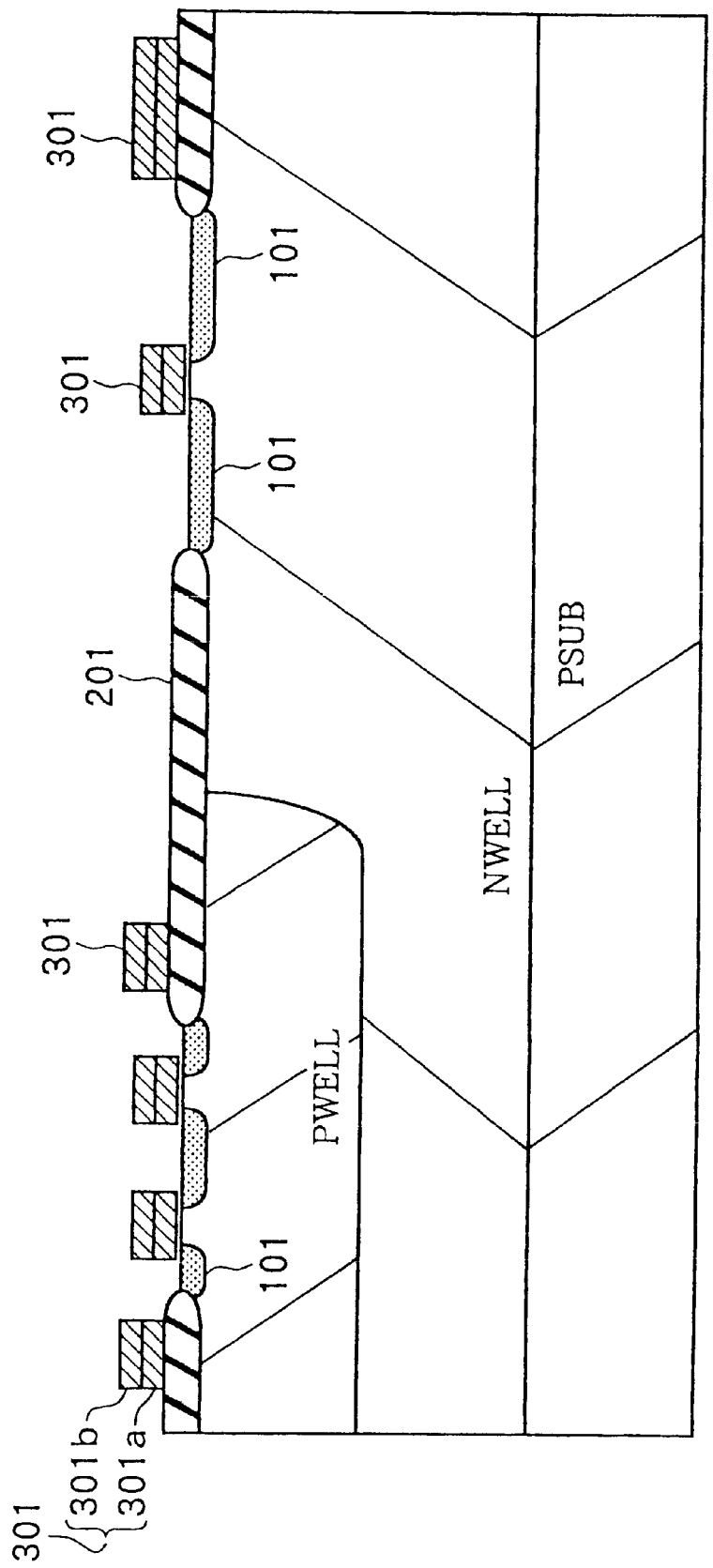
FIG. 29 to FIG. 41 are sectional views of a method for manufacturing the COB type DRAM of FIG. 28.
Figure 30:
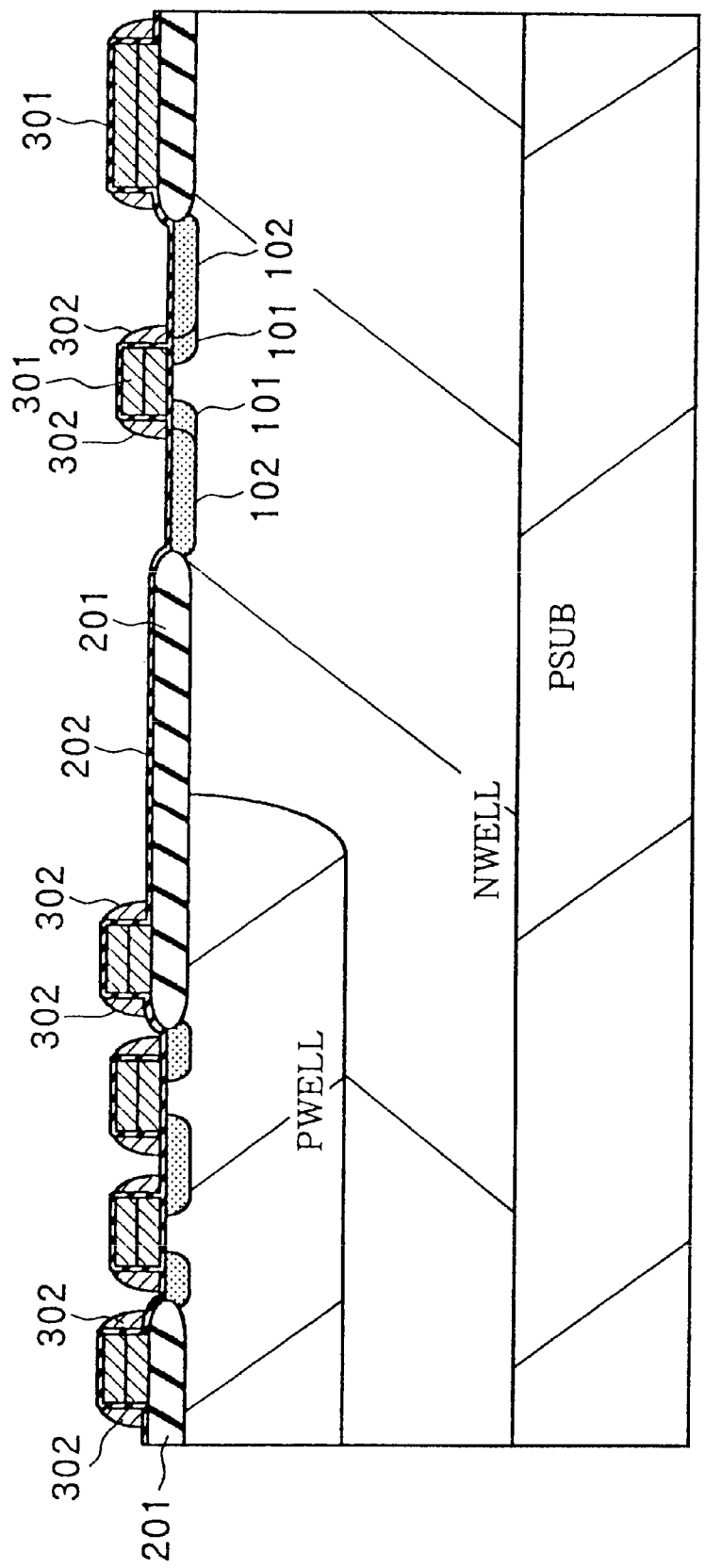
Figure 31:
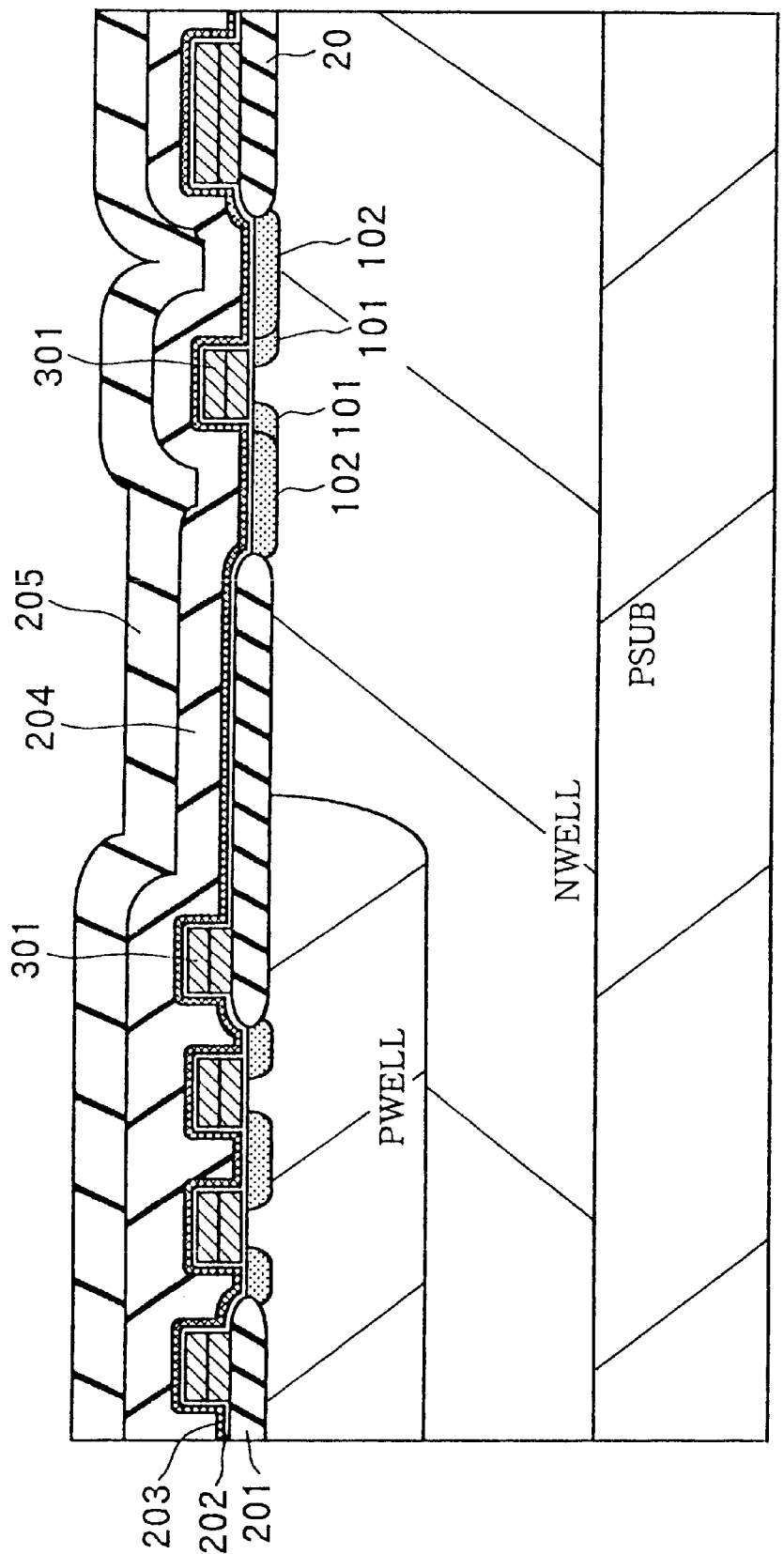
Figure 32:
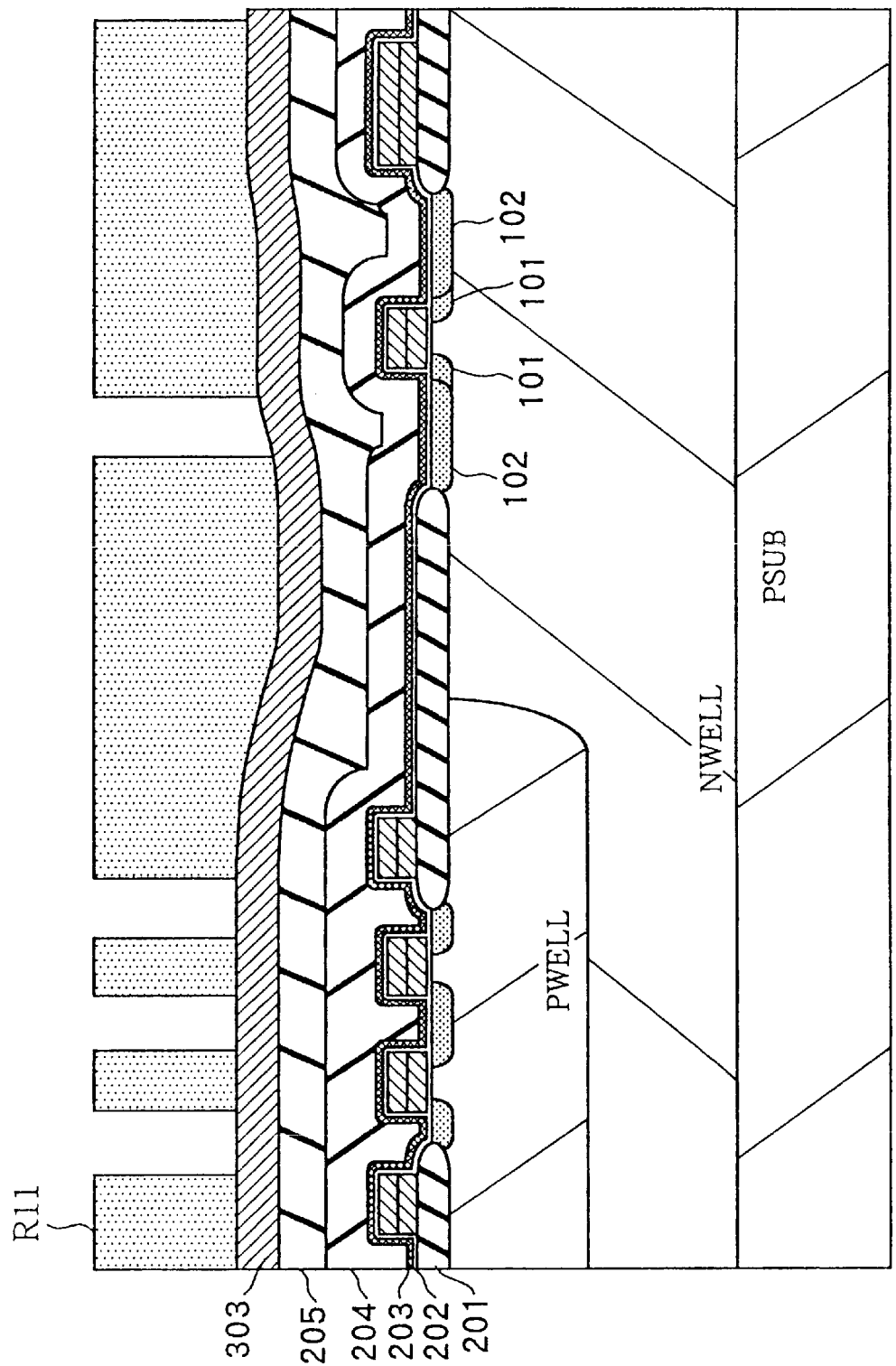
Figure 33:
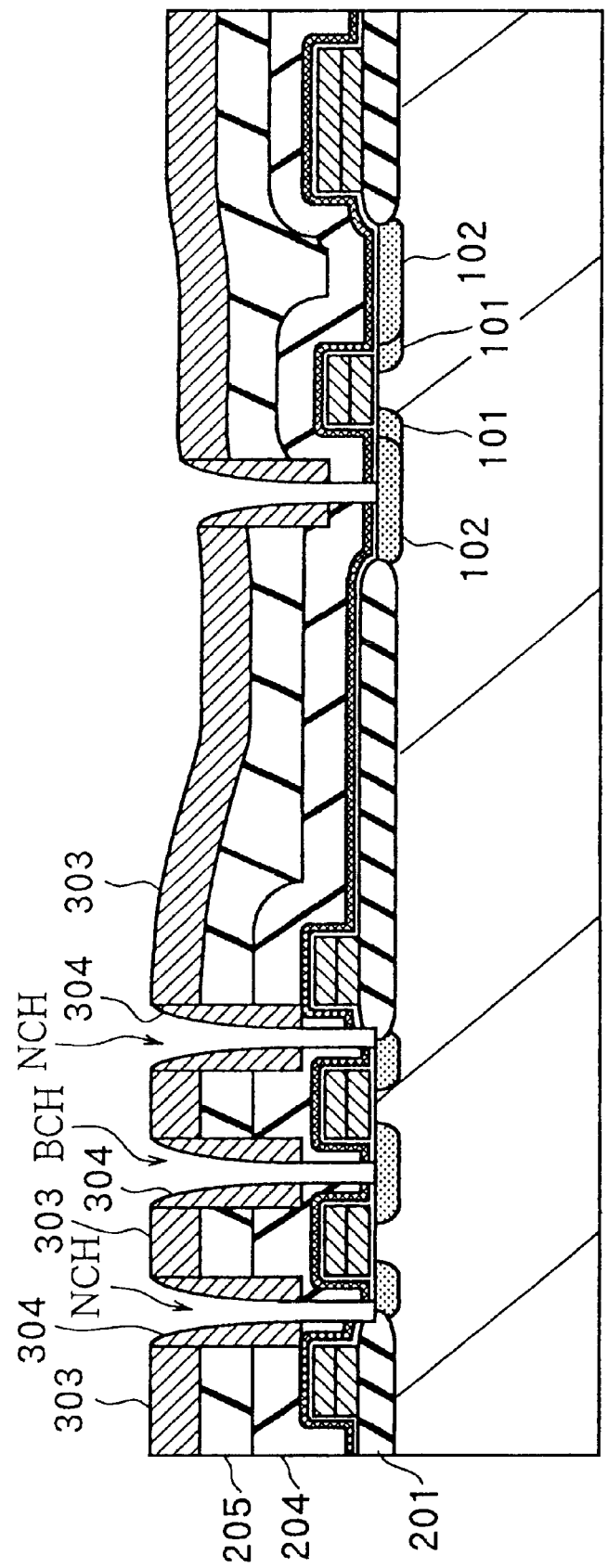
Figure 34:
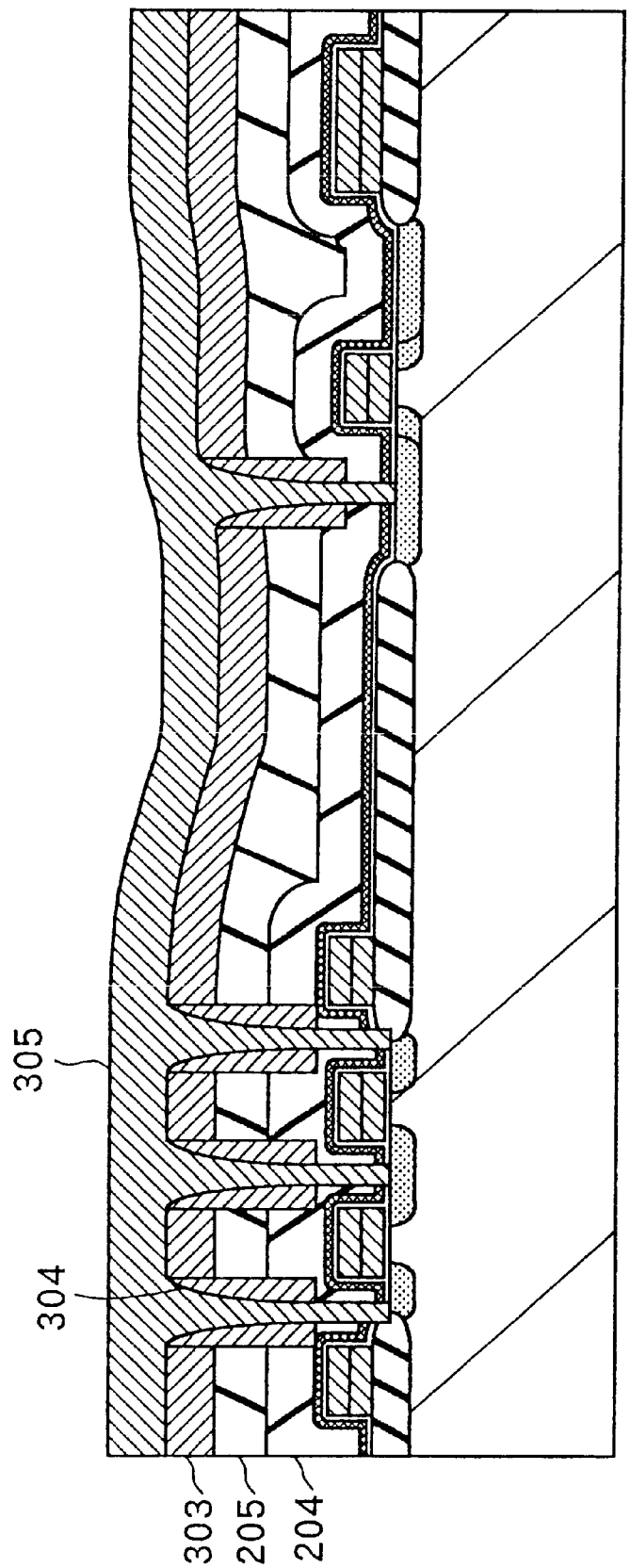
Figure 35:
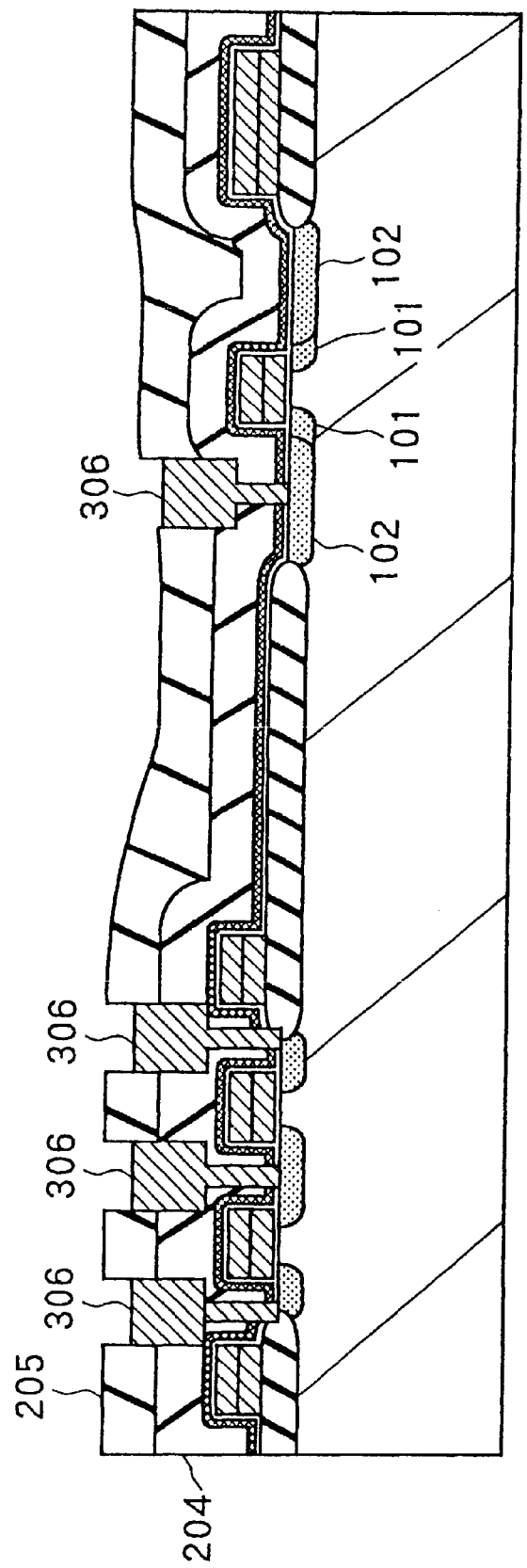
Figure 36:
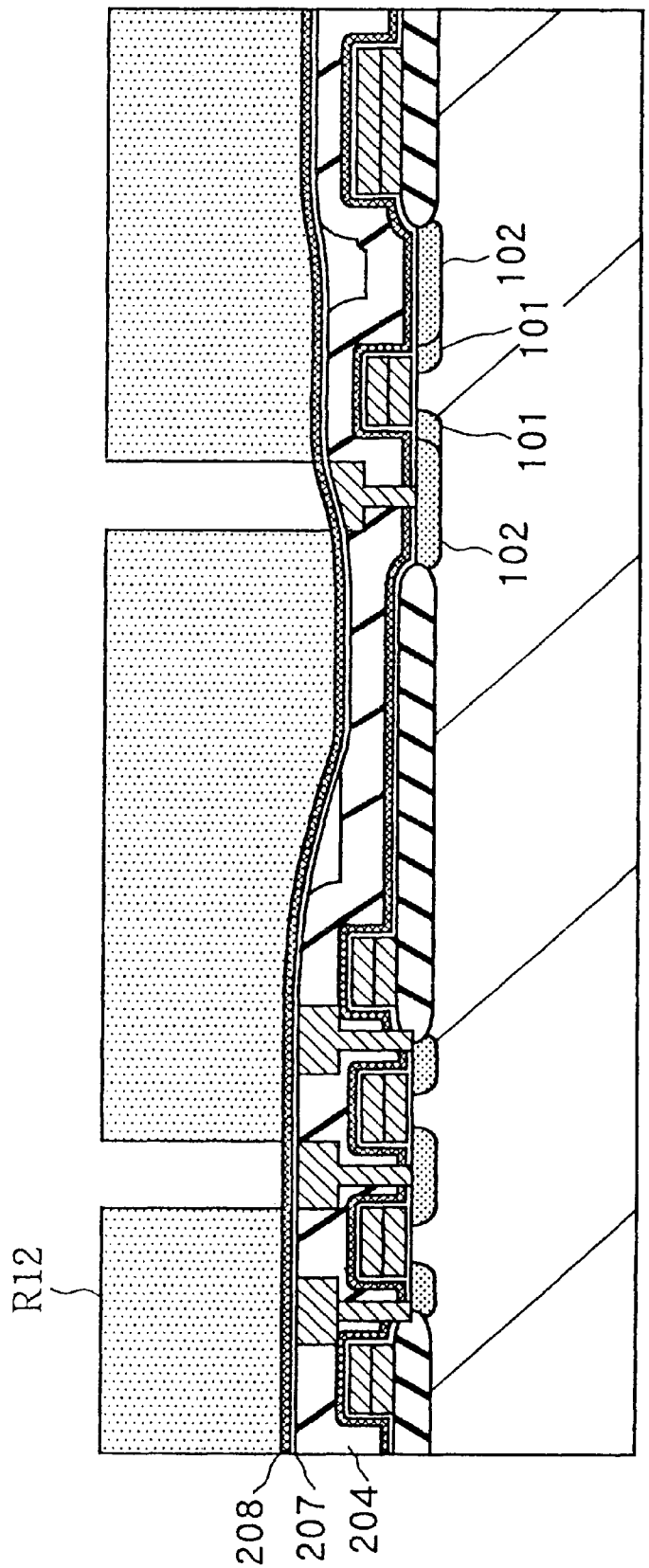
Figure 37:
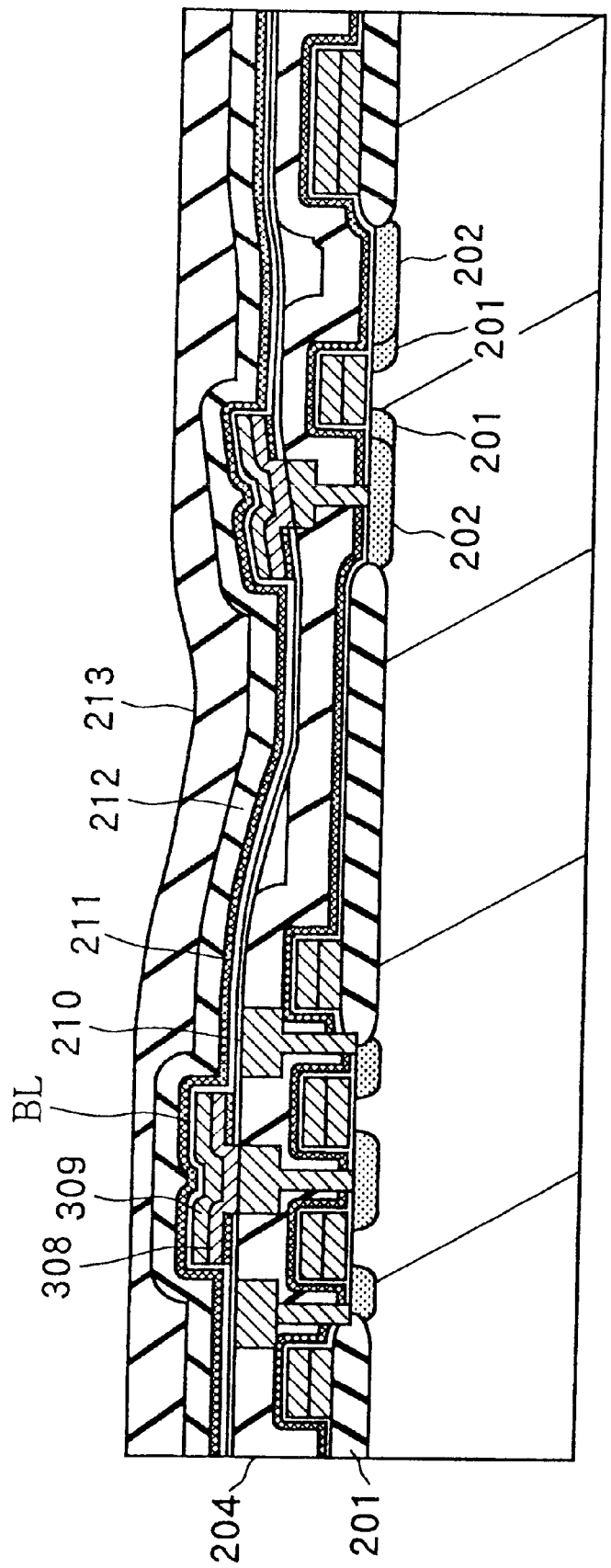
Figure 38:
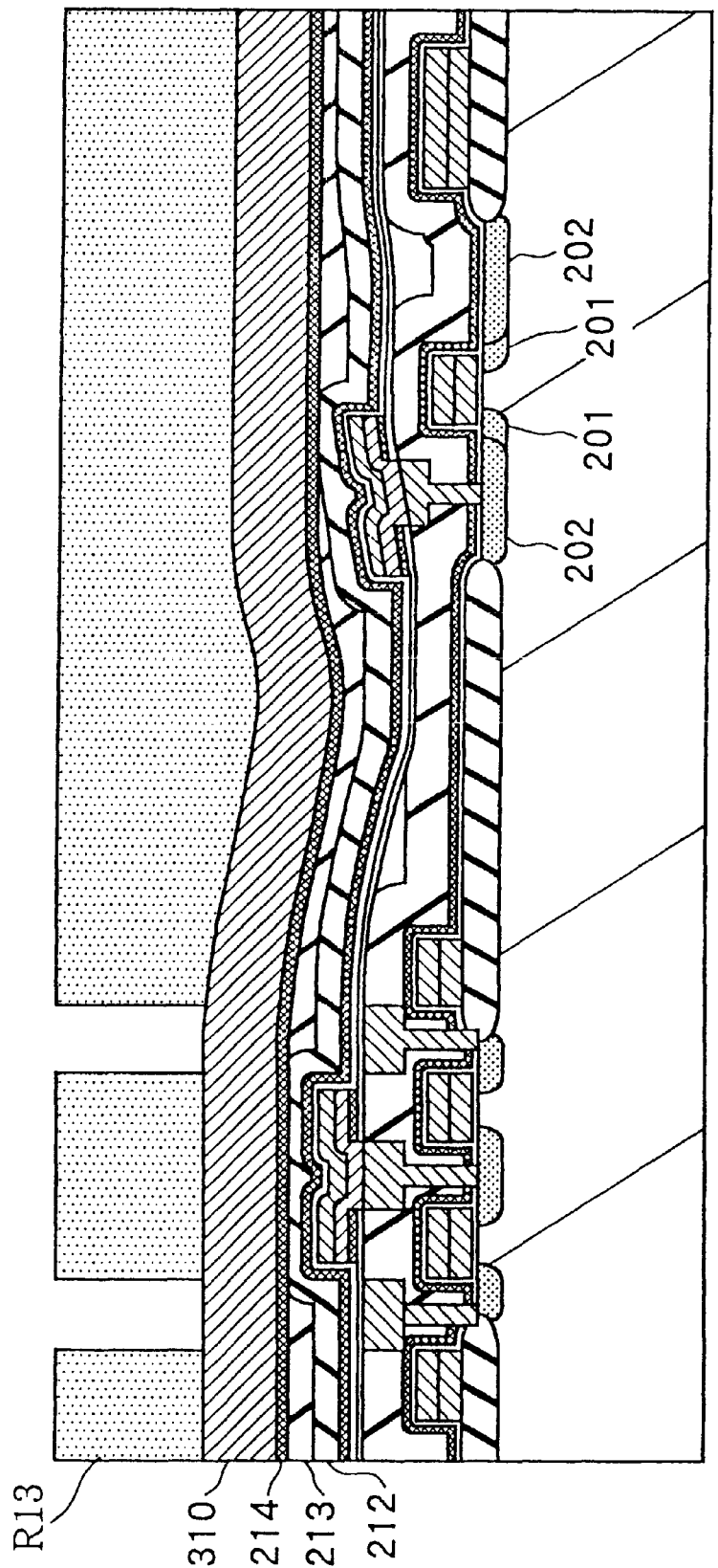
Figure 39:
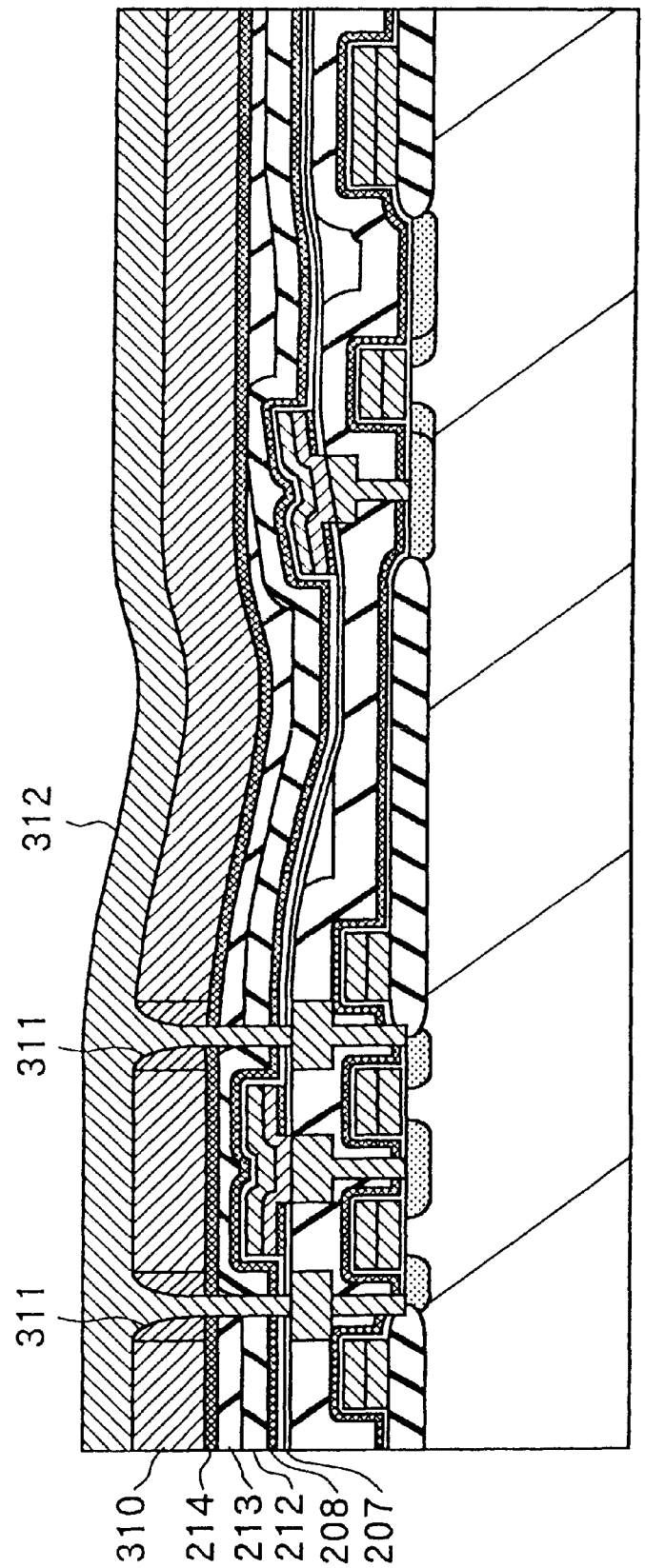
Figure 40:
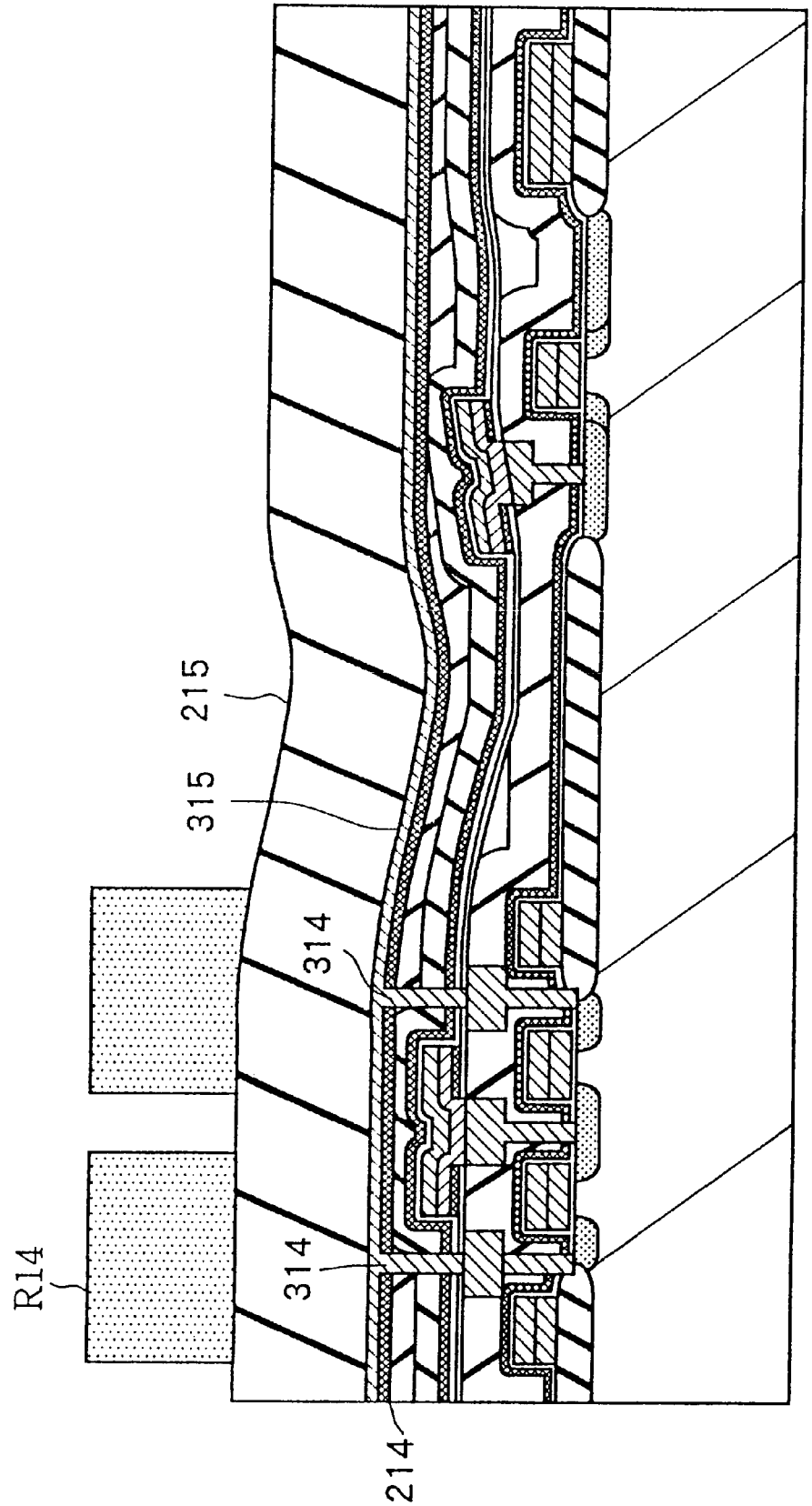
Figure 41:
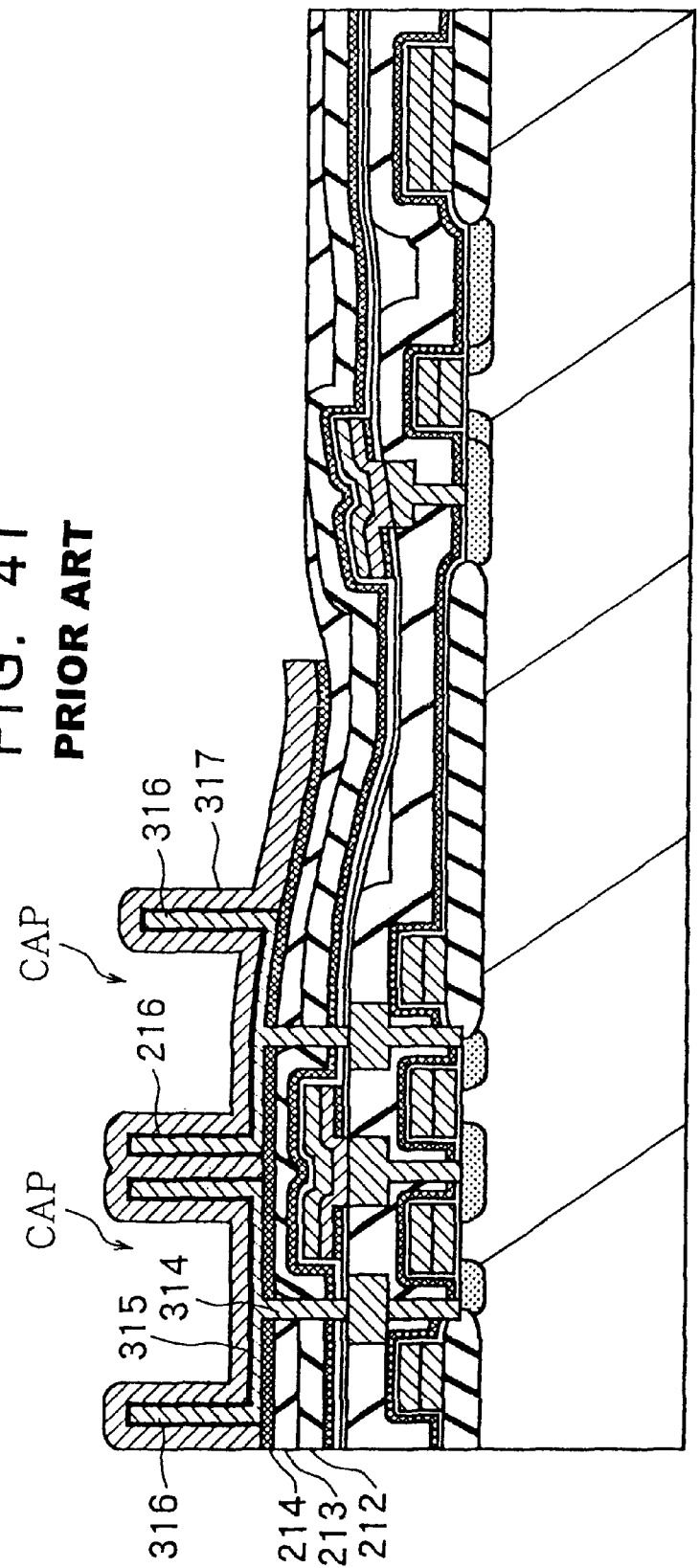

FIG. 1 is a sectional view of a COB type DRAM of a first embodiment taken along a line B–B' of FIG. 26. Note that, in all sectional views, including FIG. 1, used in the following explanation, the left side shows the memory cell portion and the right side shows the peripheral circuit portion.

In FIG. 1, reference numeral 1 is a semiconductor substrate made of for example a p-type silicon wafer, 2 is an n-type well doped with n-type impurities, 3 is a p-type well doped with p-type impurities, 4 is an element isolation insulating layer, 5 is a gate electrode of a selection transistor STr forming a word line WL, 6 is a gate electrode of a transistor of the peripheral circuit, 7 is the LDD region of a transistor, and 10a and 10b are source regions or drain regions of a transistor. Note that, in the configuration of FIG. 1, the n-type well can be replaced with an epitaxially grown layer. Further, a double-well structure comprised of an n-type well and a p-type well arranged side by side on the surface of the semiconductor substrate 1 can also be adopted.

A first inter-layer insulating layer consisting of a lower layer and an upper layer with different etching rates is formed over the selection transistor STr. In the first embodiment, the lower layer is made of a silicon nitride film 11 formed by a low pressure CVD method (hereinafter referred to as an "LP-SiN film"), the upper layer is made of an NSG film 12 and a BPSG film 13 formed by the $O_3$-TEOS method, and the surface of the upper layer is flattened. A first connecting plug 17 for bit contact is formed projecting from one impurity region 10a of the source region or drain region of the selection transistor STr, while a second connecting plug 18 for storage node contact is formed projecting from the other impurity region 10b thereof. These impurity regions penetrate through the first inter-layer insulating film.

A second inter-layer insulating film is stacked on the first inter-layer insulating film. The second inter-layer insulating film of this embodiment has a stacked layer structure comprising a silicon oxide film 21 sandwiched above and below by silicon nitride films 20 and 25. The silicon nitride films 20 and 25 function as etching stoppers at the time of forming the electrode of the storage node. The silicon oxide film 21 and the lower silicon nitride film 20 of the second inter-layer insulating film are formed with a bit line BL of the memory cell in a manner connected to the first connecting plug 17 for the bit contact. Specifically, the bit line BL is formed buried in a groove formed in the second inter-layer insulating layer. The groove is reduced in width by forming insulating side walls at the inner side faces thereof. The bit line BL is made of a metal silicide such as WSix in contact with the inner side faces of the groove and a doped polycrystalline silicon layer filled in the recess formed by the metal silicide.

On the other hand, a storage node electrode 30 of a capacitor CAP is projected from the second connecting plug 18 for storage node contact while partially buried in the second inter-layer insulating layer and extending above the second inter-layer insulating film. Explaining this more concretely, the storage node electrode 30 is a cylinder type and consists of a surrounding wall portion (conductive side wall 28) projecting from the silicon nitride film 25 and a conductive layer 29. The conductive layer 29 contacts the inner face of the conductive side wall 28 and extends into the lower second inter-layer insulating layer and thereby connects the conductive side wall 28 with the second connecting plug 18. Note that the conductive side wall 28 may for example be formed to a double-fin structure.

On the surface of the storage node electrode 30 and silicon nitride film 25, a plate electrode 32 is stacked via a capacitor dielectric film 31 made of for example an oxide-nitride-oxide ONO film. On the plate electrode 32 is stacked a third inter-layer insulating layer. An interconnection layer 36 is provided suitably connected with the plate electrode of the capacitor CAP.

On the other hand, in the peripheral circuit, the electrode of the transistor is connected with the upper interconnection layer 36 via a contacting plug 19, an electrode takeout layer (conductive layer of same configuration as the bit line BL), or a tungsten plug 34.

Note that the interconnection layer 36, while not illustrated in FIG. 1, according to need has further stacked on it a second or third interconnection layer via an inter-layer insulating layer and is covered on its surface by for example an overcoat film.

The COB type DRAM configured in this way is the same as the related art in the point that there are two inter-layer insulating layers, but the bit line BL is buried in the second inter-layer insulating film, so the flattening step can be omitted, the second inter-layer insulating layer (20, 21, and 25) can be made relatively thin, and the stacked layer structure is simpler. For this reason, there is the advantage that the aspect ratio of the contact hole for connecting the electrode of the transistor of the peripheral circuit with the upper interconnection layer 36 can be made smaller than in the related art.

Further, the storage node electrode 30 of the capacitor CAP is partially buried at the two sides of the bit line BL in the second inter-layer insulating layer (20, 21 and 25), therefore an effect of shielding the bit line BL is obtained. In the bit line BL selected at the time of reading (sensing) data, the potential sometimes changes as much as the full swing of the power supply voltage, so there is concern that induced noise may be generated in the adjoining non-selected bit lines. In this embodiment, however, such induced noise is easily absorbed by the storage node electrode 30, therefore there is there advantage that non-selected memory cells do not easily malfunction.

Next, in the case of DRAM constructed as mentioned above, an explanation will be made of embodiment of a method of manufacturing a semiconductor device by referring to FIG. 2 to FIG. 16.

Figure 2:
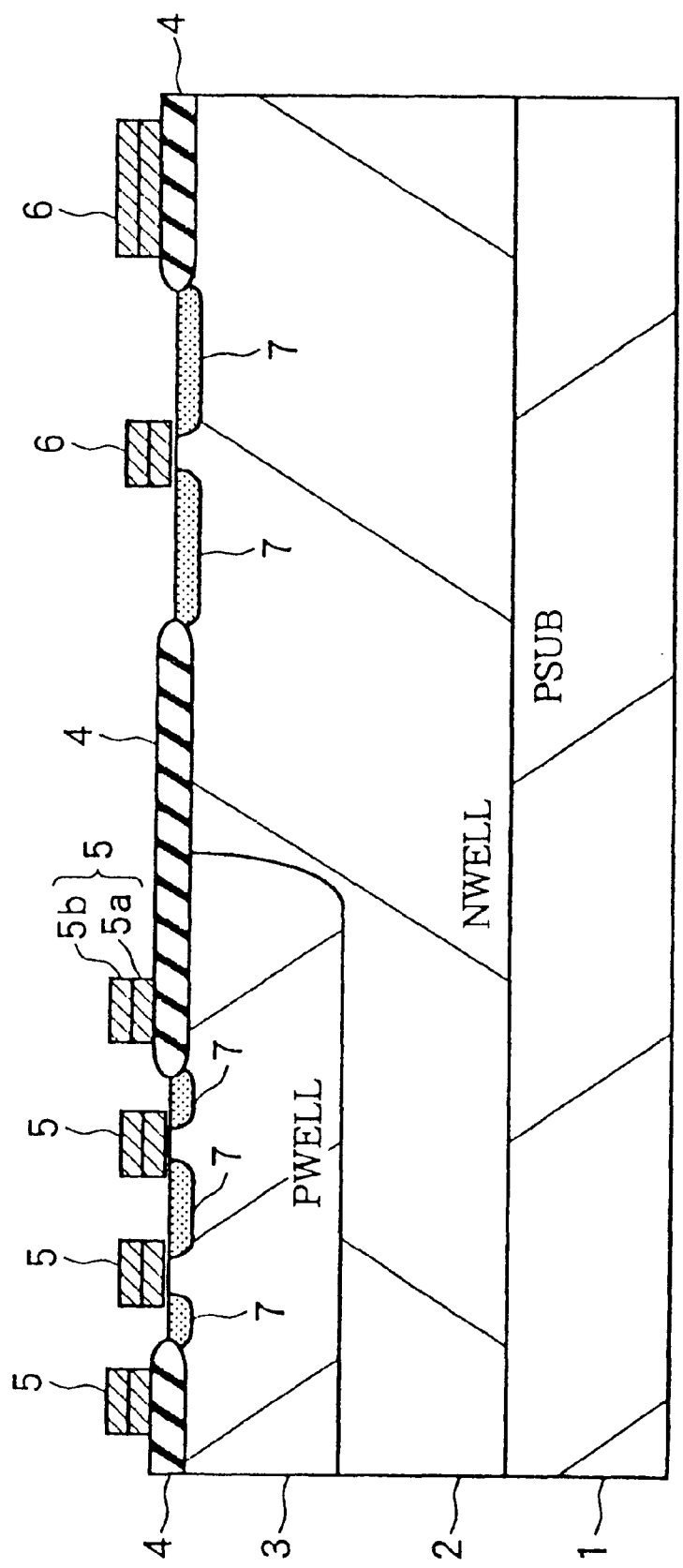
FIG. 2 to FIG. 16 are sectional views of a method of manufacturing the COB type DRAM of FIG. 1.

In the step shown in FIG. 2, first, an n-type well 2 is formed on the surface of a prepared semiconductor substrate 1 such as a p-type silicon wafer having the predetermined concentration of impurity, then a p-type well 3 is formed in a predetermined surface side position of the n-type well 2. These wells 2 and 3 are formed by a normal method, that is, repeated photolithography and ion-implantation for each well.

Next, an element isolation insulating film 4 is formed on the surface of the wells by for example the LOCOS method. The element isolation insulating film 4, not illustrated, is formed by stacking a padding oxide film and silicon nitride film or other oxidation stopping film such and patterning them by using the photolithography and etching technique, then performing LOCOS oxidation.

The oxidation stopping film and padding oxide film are removed, then the surface of the wells is thermally oxidized to form a not illustrated gate oxide film. A doped polycrystalline silicon film 5a then a tungsten silicide (WSix) film 5b are deposited on the gate oxide film by the CVD method to a thickness of several hundred nanometers. A not illustrated resist pattern is formed on the WSix film 5b, then the WSix film 5b and doped polycrystalline silicon film 5a are patterned to form gate electrodes 5 and 6 by etching using the resist pattern as a mask. Arsenic or phosphorus ions are then implanted to form an LDD region 7 using the formed gate electrodes 5 and 6 and the element Isolation insulating film 4 as masks. As the ion implantation conditions, for example, the implantation energy is set to several tens of KeV and the dosage is set to $1 \times 10^{12}/cm^2$ to $1 \times 10^{14}/cm^2$.

Figure 3:
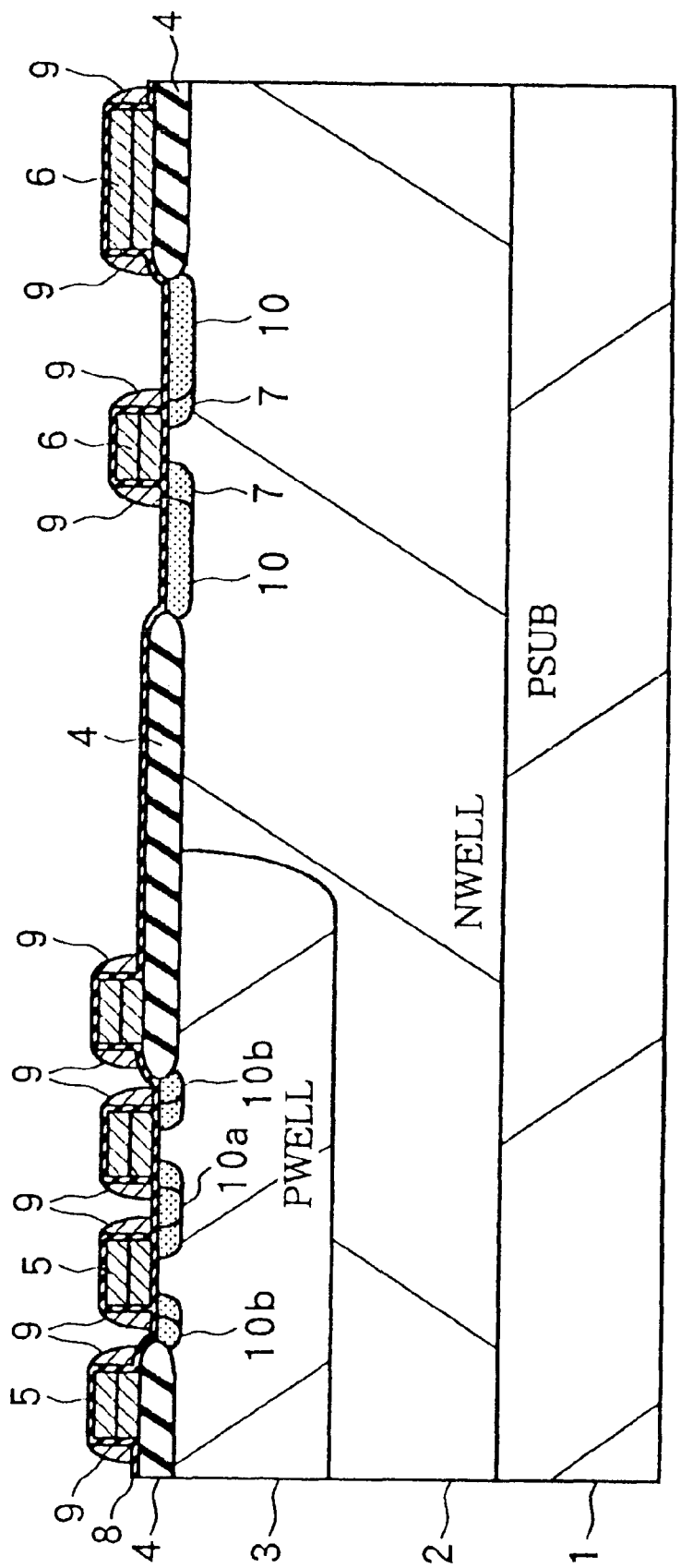

In the step shown in FIG. 3, a silicon oxide film 8 is formed to a thickness of several tens of nanometers by LP-CVD or thermal oxidation so as to cover at least the substrate and the gate electrodes 5 and 6. A polycrystalline silicon film is formed on the silicon oxide film 8 to a thickness of 100-odd nanometers by CVD, then etched anisotropically to form side walls 9 on the side faces of the gate electrodes 5 and 6. At the time of anisotropic etching, the underlying silicon oxide 8 functions as an etching stopper, so the active layer is protected. Then, a resist pattern is formed so as to mask the one of the NMOS forming region and PMOS forming region in which ions are not going to be implanted, then ion implantation is performed at the NMOS and PMOS sides using as a self-alignment mask at the other open portion the gate electrodes 5 and 6, the side walls 9, and the element isolation insulating film 4. In the ion implantation to the NMOS side, for example, arsenic ions are doped under conditions of an implantation energy of tens of keV and a dosage of $1 \times 10^{15}/cm^2$ to $1 \times 10^{16}/cm^2$. Further, in the ion implantation to the PMOS side, for example, $BF_2^+$ is doped under conditions of an implantation energy of tens of keV and a dosage of $1 \times 10^{15}/cm^2$ to $1 \times 10^{16}/cm^2$. As a result, source and drain regions 10a and 10b are formed in the well surface portions outside the gate electrodes 5 and 6.

Figure 4:
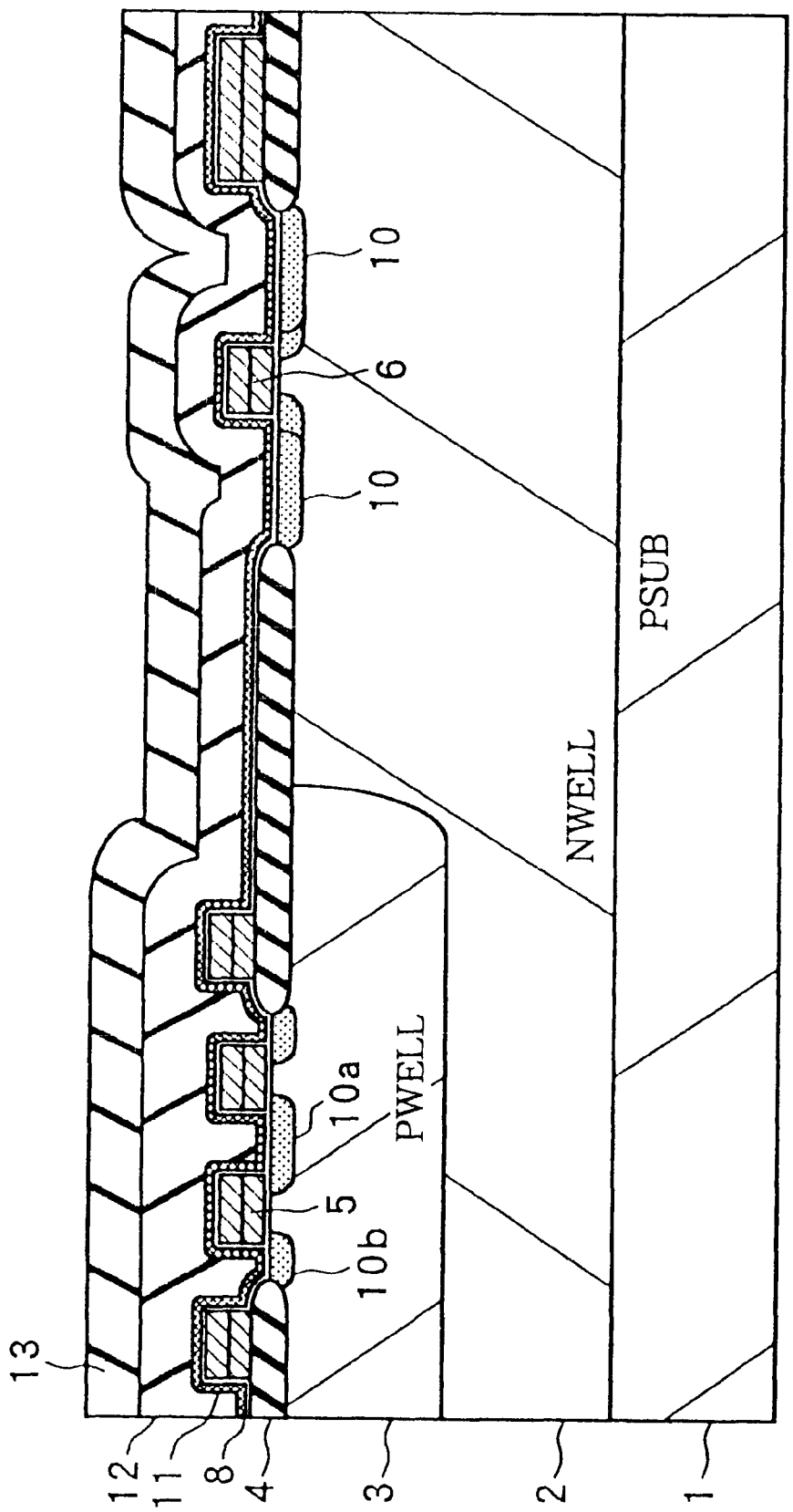

The side walls a are removed, then, as shown in FIG. 4, a silicon nitride film 11 is formed to a thickness about tens of nanometers by LP-CVD, then an NSG film 12 and BPSG film 13 are formed in that order by $O_3$-TEOS method to thicknesses of several hundreds of nanometers.

Figure 5:
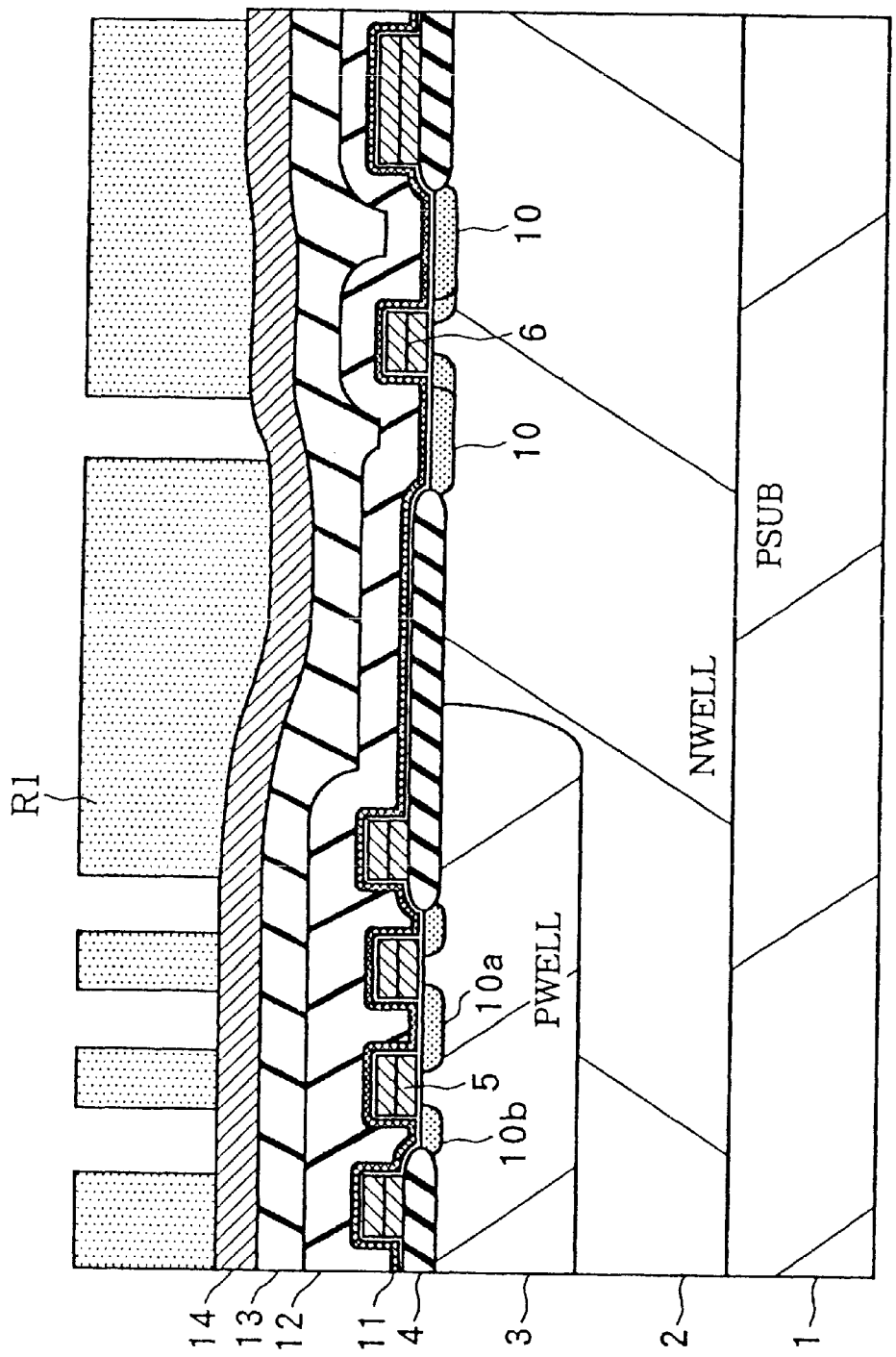

As shown in FIG. 5, the BPSG film 13 is reflowed to flatten the surface of the BPSG film, then a polycrystalline silicon film 14 is deposited to a thickness of hundreds of nanometer. A resist pattern R1 for simultaneous formation of contacts is then formed. The resist pattern R1 is open at the bit contact and node contact portions of the memory cells and open over predetermined transistors of the peripheral circuits.

Figure 6:
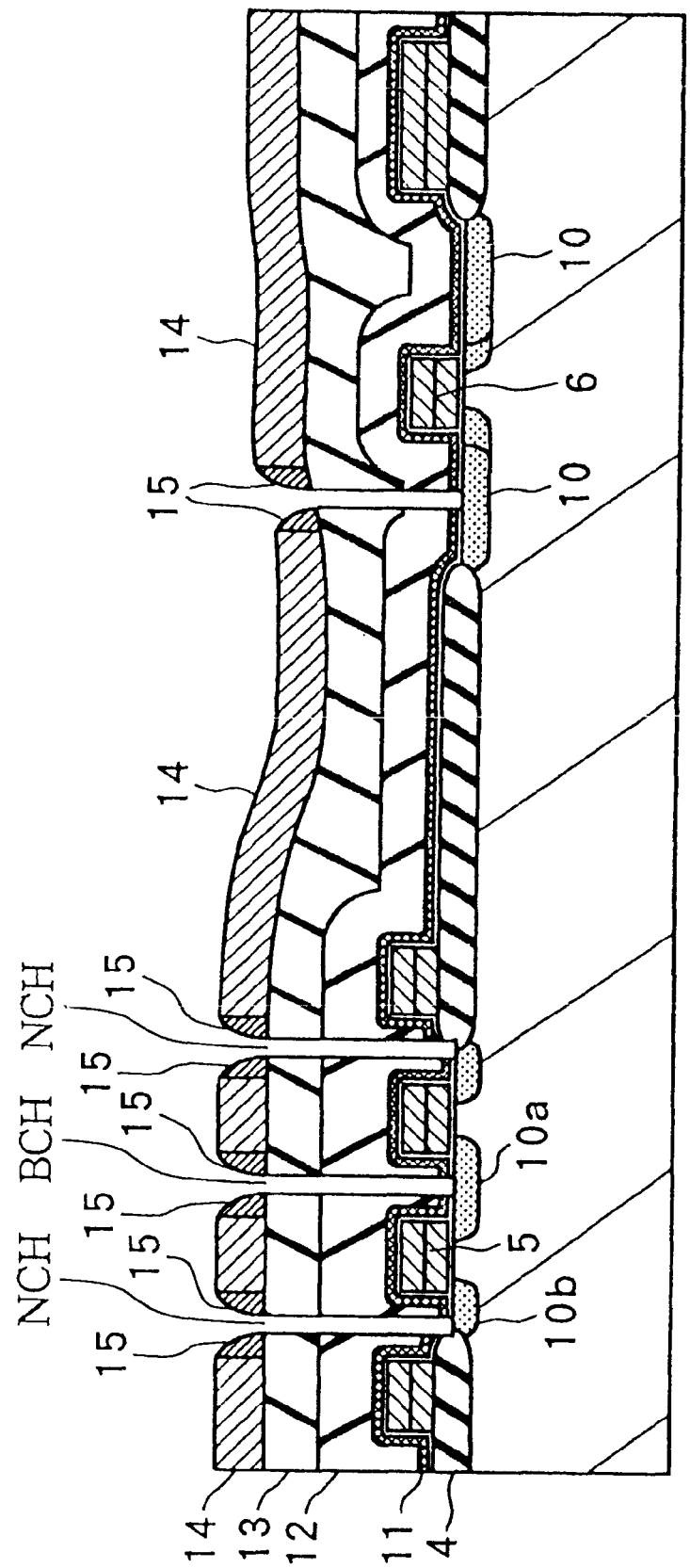

As shown in FIG. 6, by using the resist pattern R1 as a mask, the underlying polycrystalline silicon film 14 is etched anisotropically to form preparatory contact holes. The resist pattern R1 is removed, then another polycrystalline silicon film is formed by CVD on the patterned polycrystalline silicon film 14 to a thickness of tens to a 100 odd nanometers. The upper polycrystalline silicon film in this state is anistropically etched to form side walls 15 made of polycrystalline silicon at the side faces of the preparatory contact holes to reduce the diameter thereof. The BPSG film 13, the NSG film, the silicon nitride film 11, and the silicon oxide film 8 are then successively etched using the polycrystalline silicon film 14 and the side walls 15 as masks. This forms contact holes which penetrate through these stacked films and reach the semiconductor substrate and are reduced in diameter by the side walls. Explaining this in further detail, a bit contact hole BCH is formed in one of the impurity regions, that is, the region 10a, of the source and drain regions of the selection transistor STr. Simultaneously, a node contact hole NCH is formed in the other impurity region 10b. Further, in the peripheral circuit, a contact hole is formed simultaneously in a source and drain region 10 of the transistor.

Figure 7:
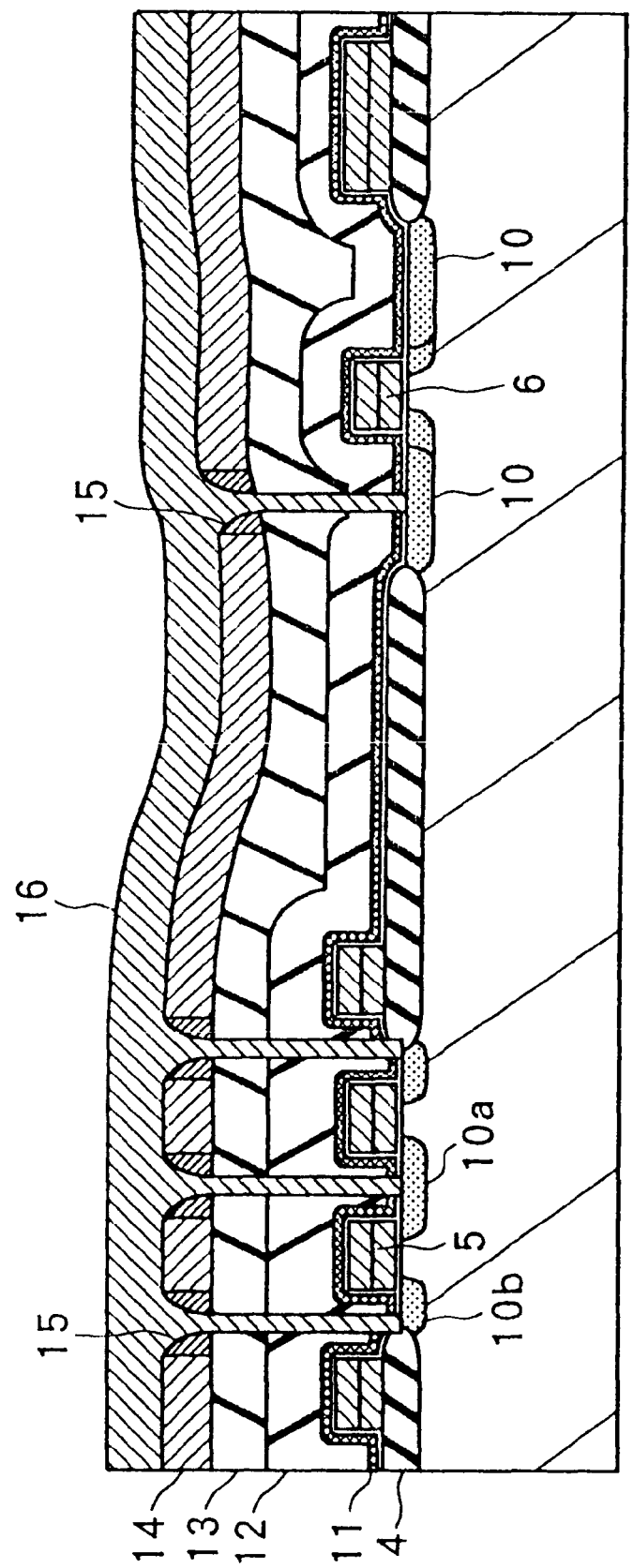

Next, as shown in FIG. 7, a doped polycrystalline silicon film 16 is deposited by CVD to a thickness of hundreds of nanometers so as to bury all contact holes including the bit contact hole BCH and the node contact hole NCH by polycrystalline silicon.

Figure 8:
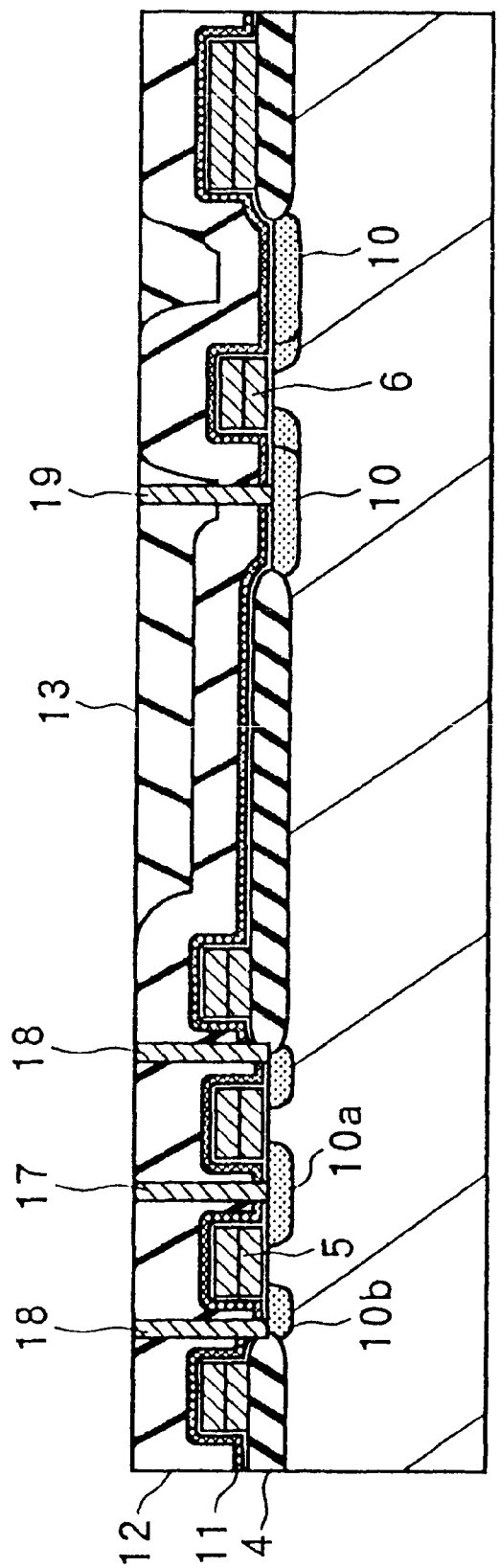

Then, as shown in FIG. 8, the doped polycrystalline silicon film 16, the polycrystalline silicon film 14, and the side walls 15 are removed by the etch back method or the chemical mechanical polishing (CMP) method. Then, the surface of the first inter-layer insulating film (13 and 12) is flattened by the CMP method and so forth. By this, the doped polycrystalline silicon film 16 is shaved and divided into a first connecting plug 17 buried in the bit contact hole, a second connecting plug 18 buried in the node contact hole, and a third connecting plug 19 buried in the contact hole of the peripheral circuit.

Figure 9:
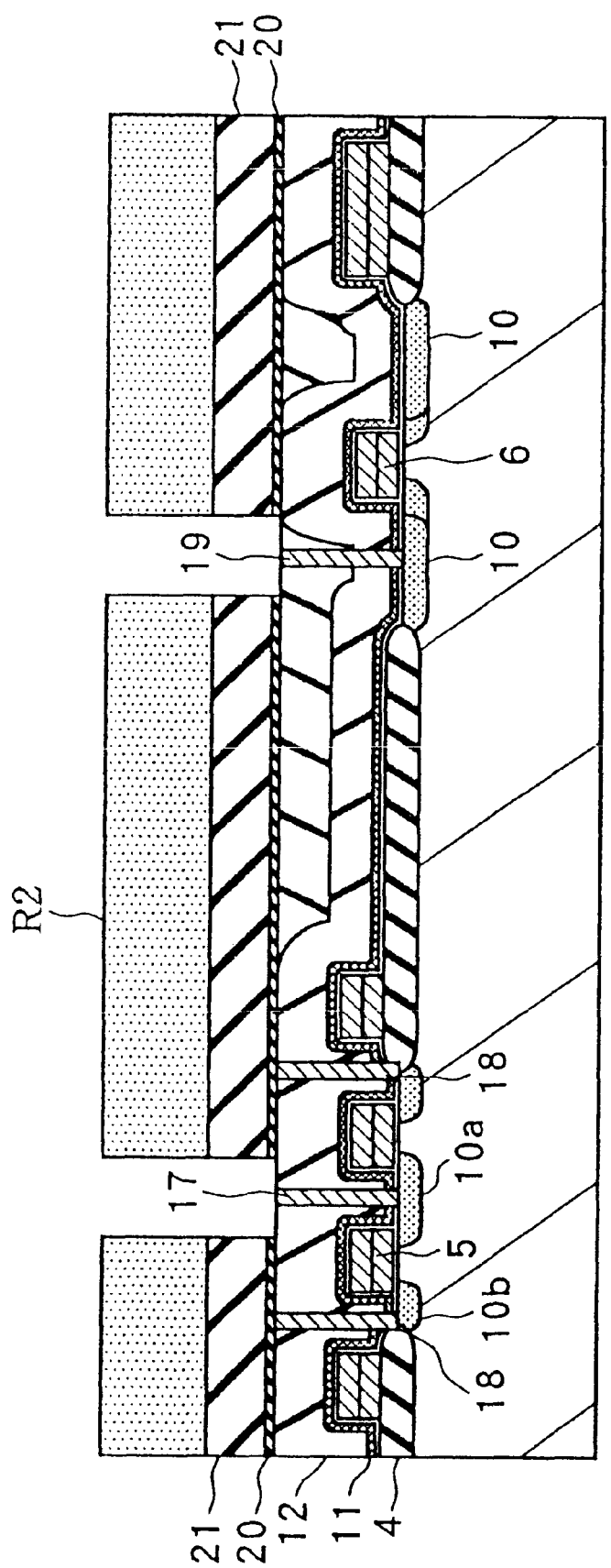

As shown in FIG. 9, a second inter-layer insulating layer comprising, for example, an LP-SiN film 20 having a thickness about tens of nanometers and a silicon nitride film 21 having a thickness of hundreds of nanometers are deposited by CVD on the flattened surface from which the plugs are exposed. An inverted pattern of the normal bit line pattern, namely a resist pattern R2 open at the bit line forming portions is formed, then this is used as a mask to etch the silicon oxide film 21. At this time, the silicon nitride film 20 formed underneath functions as an etching stopper to protect the further underlying NSG film 12 and so forth. Next, the LP-SiN film 20 is selectively removed to expose the end face of the first connecting plug 17 for bit contact. This forms a bit line burying groove in the LP-SiN film 20 and the silicon oxide film 21. Simultaneously, in the peripheral circuit, the end face of the third connecting plug 19 is exposed at the bottom of the groove.

Figure 10:
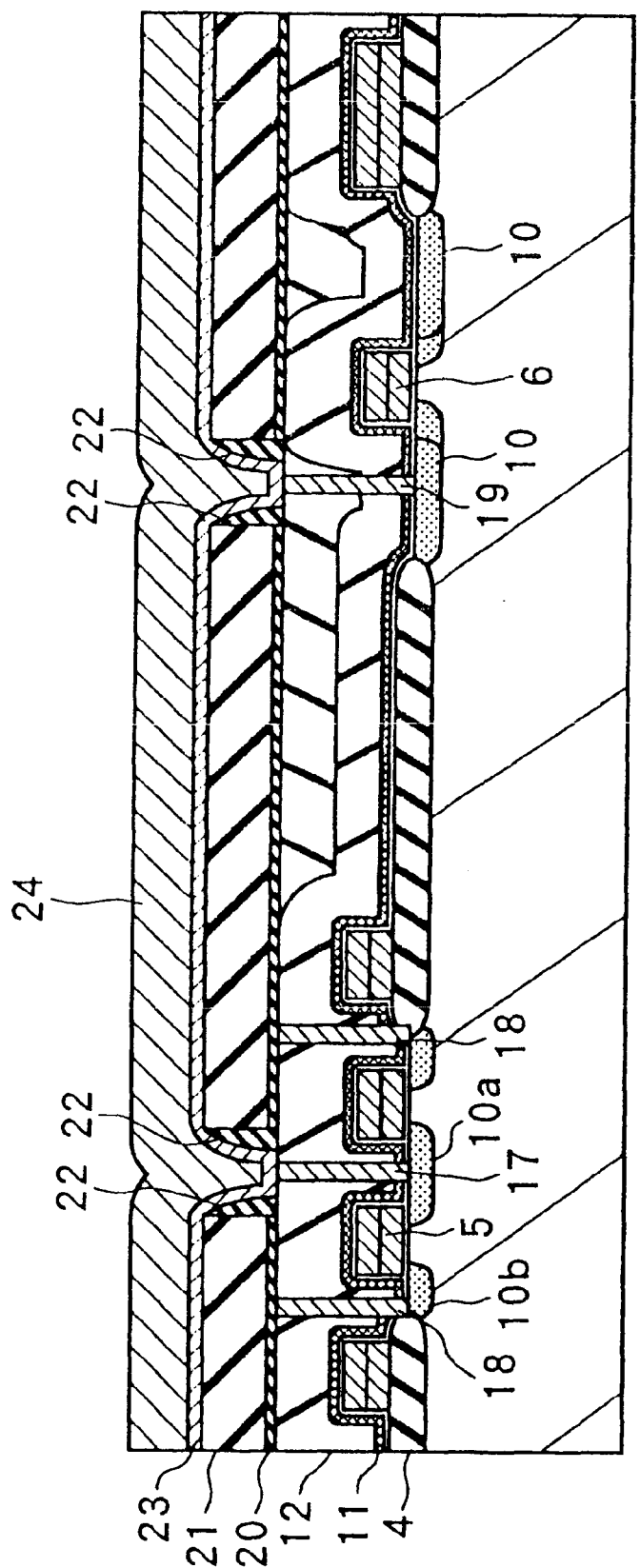
Figure 11:
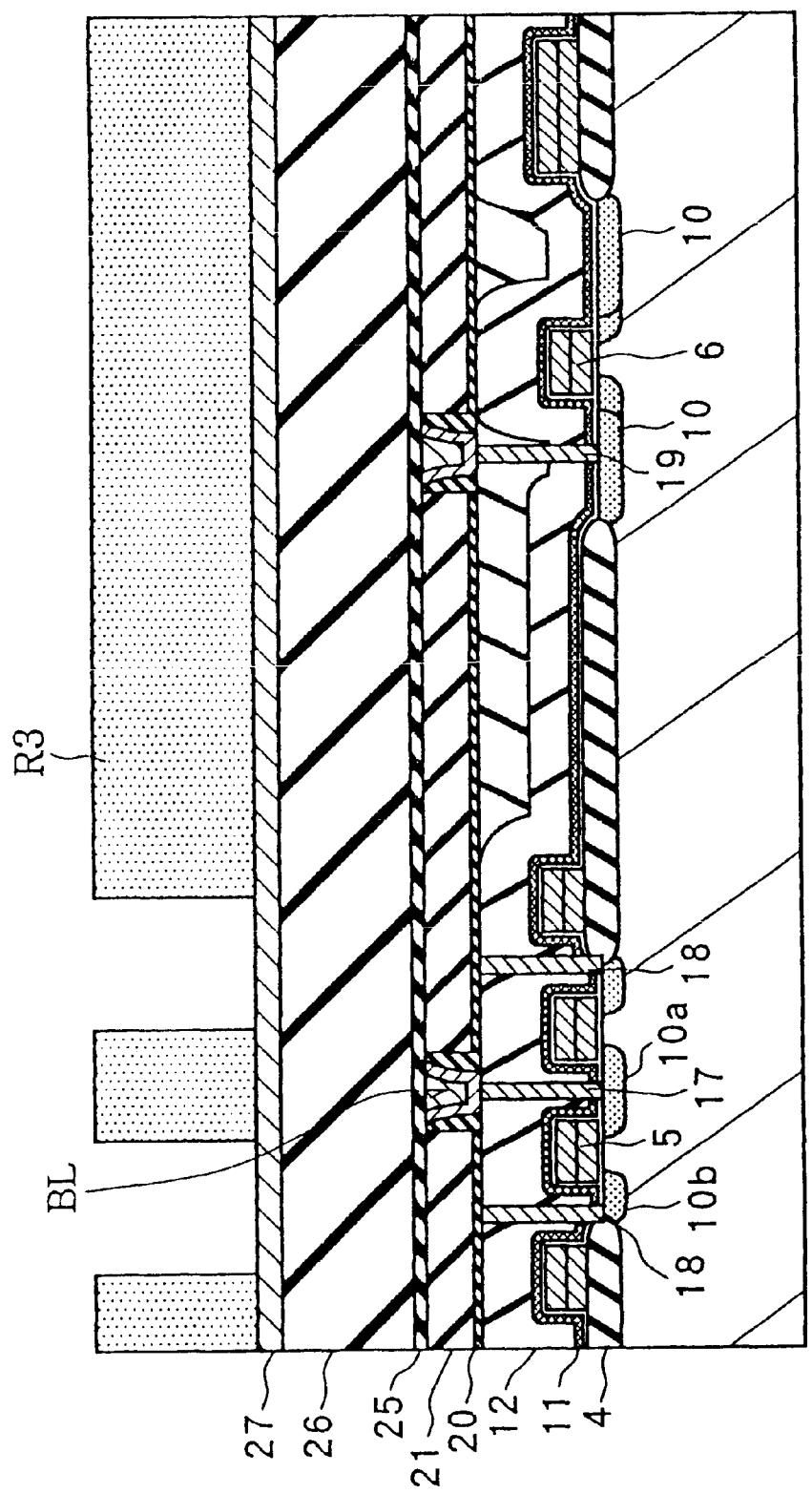

In the step shown in FIG. 10, first an insulating film made of silicon oxide or silicon nitride is formed and then anisotropically etched to form insulating side walls at the inner face of the bit line burying groove. In this state, a WSix film 23 is formed by CVD to a thickness tens of nanometers over the entire surface. Next, a polycrystalline silicon film 24 doped with phosphorus and made conductive is deposited by CVD to a thickness about hundreds of nanometers to bury the bit line burying groove.

Next, the portion of the doped polycrystalline silicon film 24 and WSix film 23 on the silicon oxide film 21 is removed by etching or CMP. As shown in FIG. 1, this forms a bit line BL. The bit line BL is buried in the groove of the inter-layer insulating films 20 and 21 and contacts the first connecting plug 17 for bit contact.

Next, a silicon nitride film 25 is formed over the entire surface to a thickness of tens of to a 100-odd nanometers. Then, a silicon oxide film 26 having a thickness of hundreds of nanometers and a polycrystalline silicon film 27 having a thickness of tens of nanometers are deposited in that order by CVD. This thickest silicon oxide film 26 functions as a sacrificial layer which acts as a kind of "mold" at the time of forming the electrode of the storage node and is then removed. An inverted pattern of the storage node electrode pattern, namely a resist pattern R3 open over the storage node electrode forming portion, is formed on the polycrystalline silicon film 27.

Figure 12:
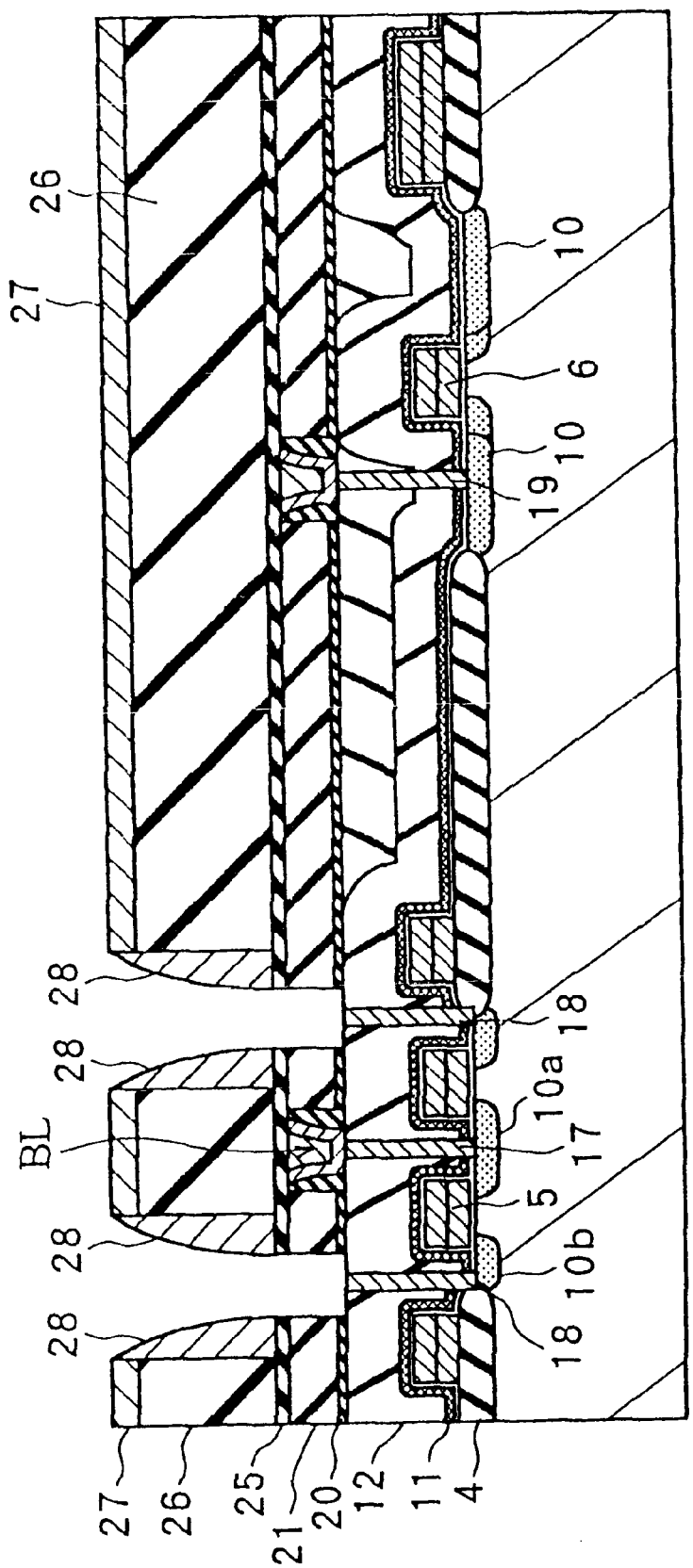

As shown in FIG. 12, the underlying polycrystalline silicon film 27 and silicon oxide film 26 are etched using the resist pattern R3 as a mask so as to form a groove for the storage node electrode. At the time of etching the silicon oxide film 26, the underlying silicon nitride film 25 functions as an etching stopper and protects the further underlying silicon oxide film 21. Next, a doped polycrystalline silicon film is formed over the entire surface, then is anisotropically etched to form conductive side walls 28 at the inner face of the groove for the storage node electrode. Then, the underlying silicon nitride film 25, the silicon oxide film 21, and the silicon nitride film 20 are etched in that order using the side walls 28 and the upper polycrystalline silicon film 27 as masks to be exposed at the end face of the second connecting plug 18 for node contact. By this, the groove for the storage node electrode is extended to the second inter-layer insulating layer beneath the former groove.

Figure 13:
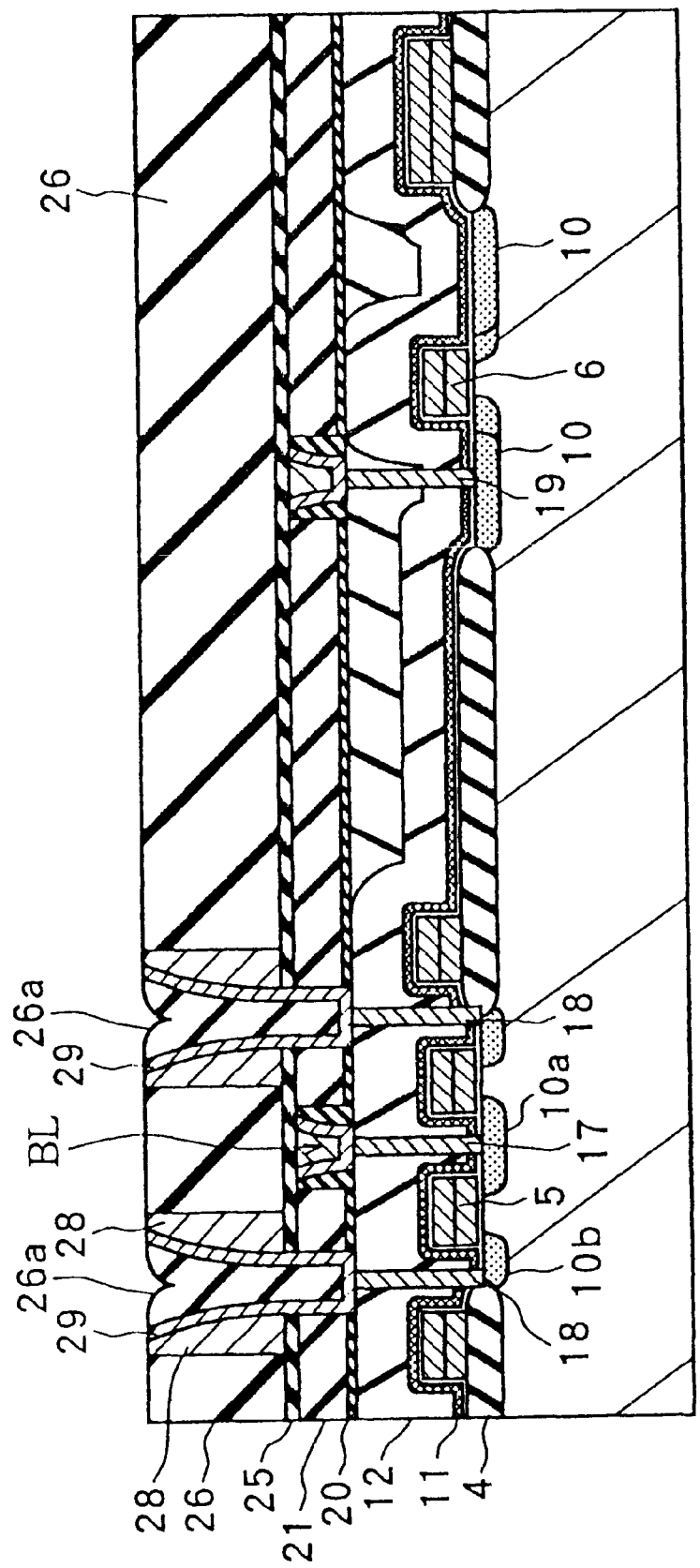

In the step shown in FIG. 13, first, a doped polycrystalline silicon film 29 is formed over the entire surface, then a silicon oxide film is formed by CVD to a thickness of hundreds of nanometers to completely bury the groove for the storage node electrode. Then, as shown in FIG. 13, a protective layer 26a is formed inside the storage node electrode. The entire surface is etched under the etching conditions for the polycrystalline silicon in the state with the protective layer 26a formed, whereby the exposed upper portion of the doped polycrystalline silicon film 29 and the upper portions of polycrystalline silicon film 27 and conductive side walls 28 are shaved to the same height as the protective layer 26a.

Figure 14:
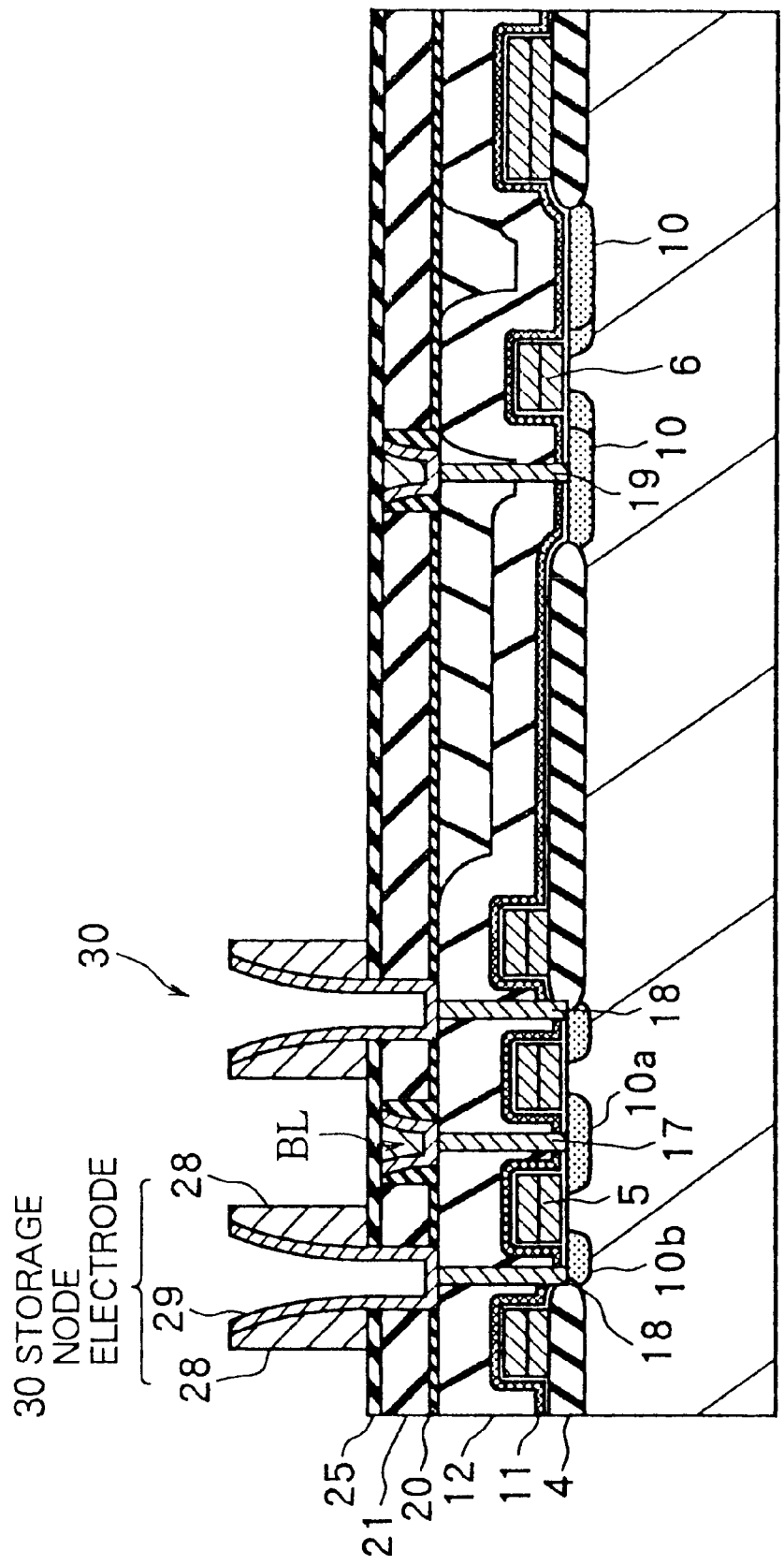

Next, wet etching is performed using a diluted solution of fluoric acid to selectively etch the protective layer 26a and the surrounding silicon oxide layer 26. As shown in FIG. 14, this forms a storage node electrode 30 comprised of the conductive side wall 28 and a doped polycrystalline silicon film 29 for each capacitor. The conductive side wall 28 projects from the second inter-layer insulating film around the groove. The doped polycrystalline silicon film 29 contacts the inner face of the conductive side wall 28 and extends inside of the groove to electrically connect with the second connecting plug for node contact exposed at the inner bottom face of the groove.

Figure 15:
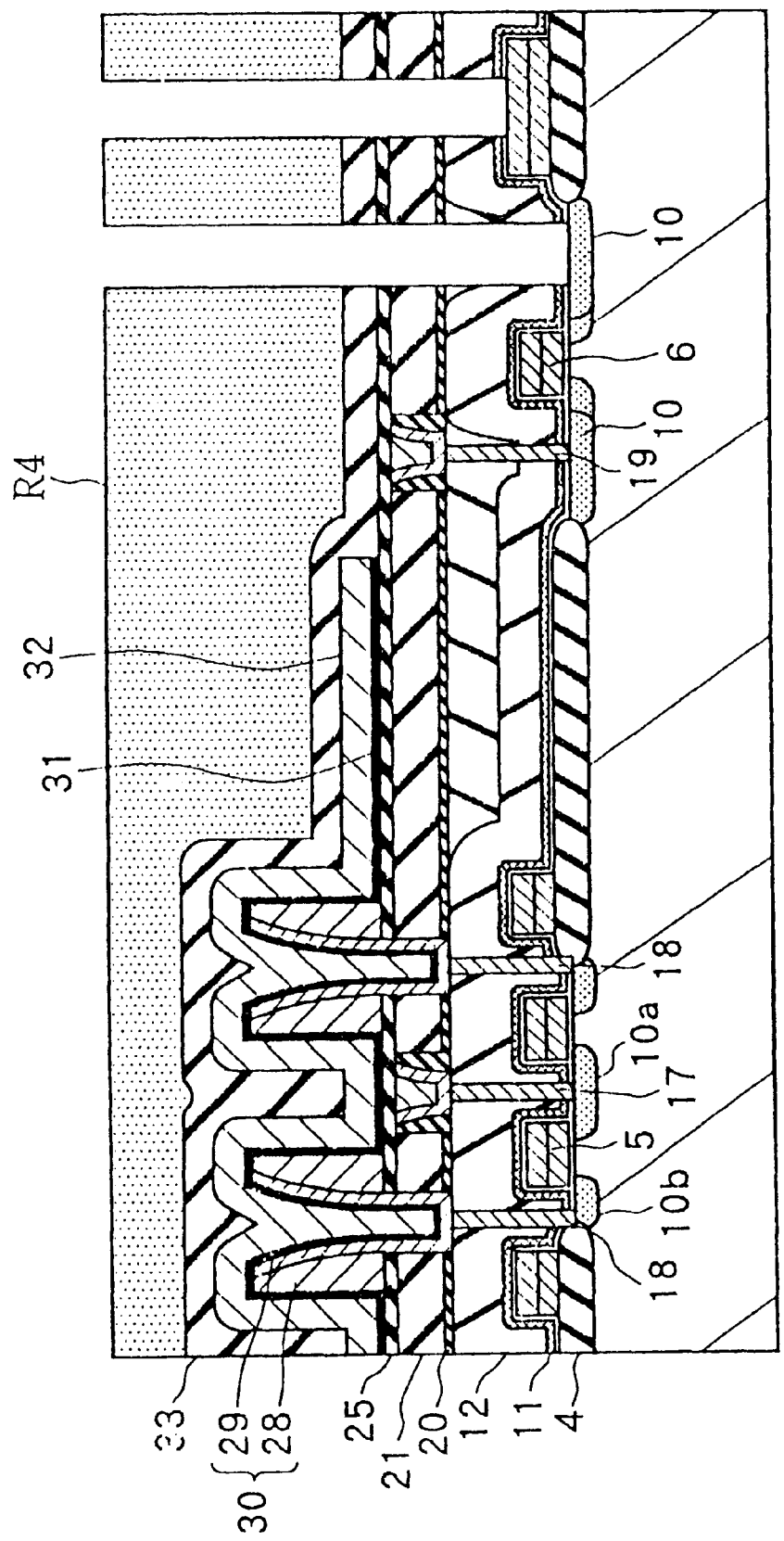

In the step shown in FIG. 15, first, a capacitor dielectric film is formed to cover the surface of the storage node electrode 30. In this step of forming the capacitor dielectric film, in the case of forming an ONO film for example, first rapid thermal annealing (RTA) is performed in an atmosphere of ammonia gas as heat treatment of the surface of the storage node electrode 30. Next, a silicon nitride film is formed by CVD, then the surface is thermally oxidized.

After the formation of the capacitor dielectric film 31, a doped polycrystalline silicon film 32 is formed over the entire surface, then a resist pattern is formed for plate electrode processing. Using this resist pattern as a mask, the doped polycrystalline silicon film 32 and capacitor dielectric film 31 are patterned into predetermined patterns to form a capacitor CAP comprised of the capacitor dielectric film 31 and the plate electrode 32 stacked on the storage node electrode.

Next, a silicon oxide film 33 is formed by CVD as a third inter-layer insulating film. A resist pattern R4 open over predetermined positions of the peripheral circuit is formed on the silicon oxide film 33, then used as a mask for anisotropic etching to form contact holes.

Figure 16:
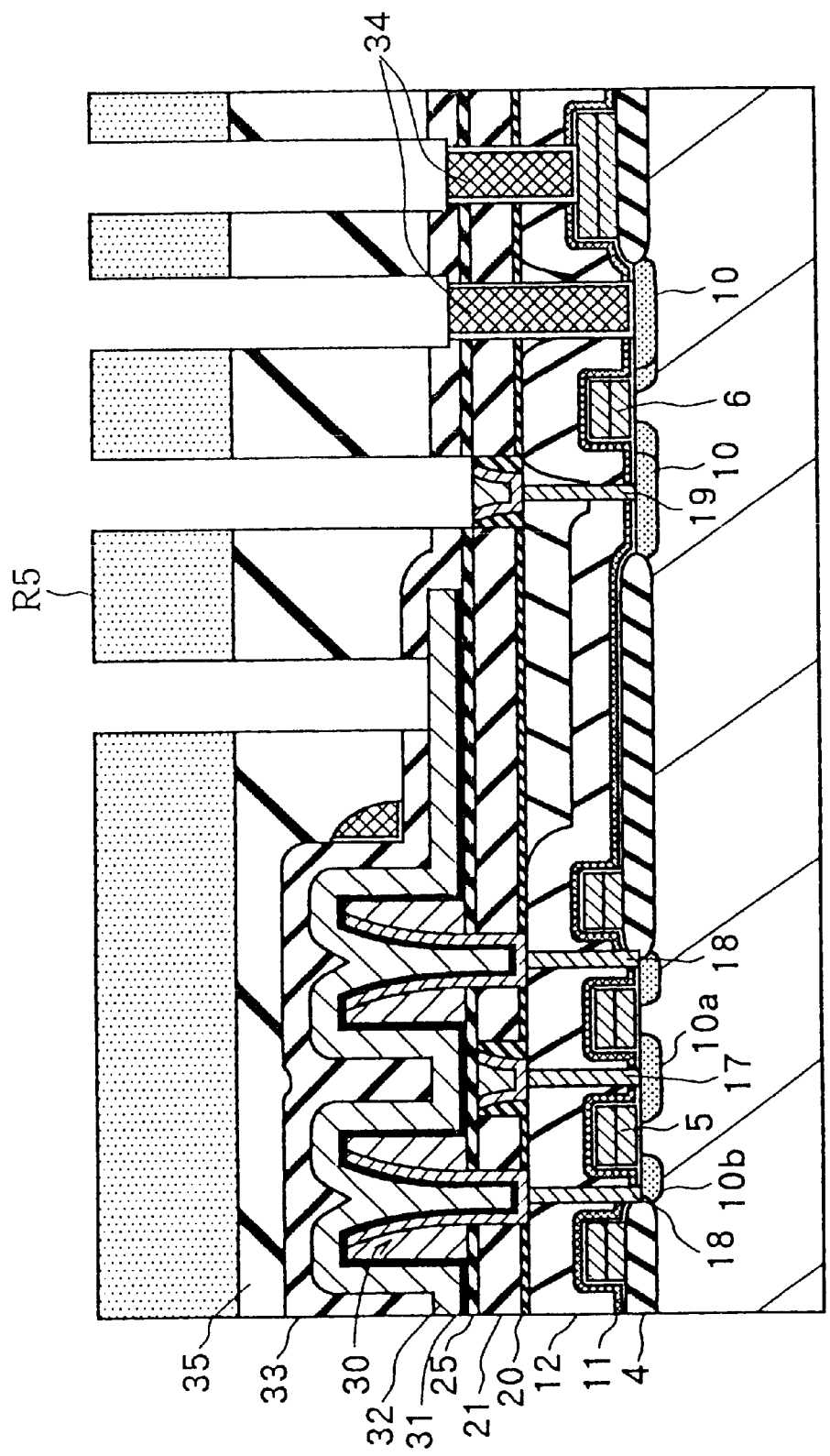

As shown in FIG. 16, the resist pattern R4 is removed, then a tungsten (W) plug 34 is formed in the contact hole in the peripheral circuit. In this step of formation of a tungsten plug, a Ti/TiN film is thinly formed as a closely adhering layer covering the inside of the contact hole, then a tungsten film is deposited to a thickness of hundreds of nanometers, then etched back. Note that, as the method of forming the tungsten plug 34, it is possible to use the method of selectively forming tungsten by CVD on the conductive layer exposed through the contact hole in addition to the method of forming a blanket tungsten plug.

As a third inter-layer insulating layer, a silicon oxide film 35 is deposited to a thickness about several hundreds of nanometers, then the surface thereof is flattened. A resist pattern R5 is formed on the flattened surface of the silicon oxide film 35. The resist pattern R5 opens over the top face of the tungsten plug 34, the extended electrode layer in the peripheral circuit formed simultaneously with the bit line BL in memory cell, and the plate electrode 32. Using the resist pattern R5 as a mask, the silicon oxide films 35 and 33 (and the silicon nitride film 25) are etched in order to form the predetermined contact holes.

After this, a tungsten film is formed as in the case of forming a blanket tungsten plug, then is patterned, not etched back, to form an interconnection layer 36 made of tungsten.

Note that another method may be used, that is, forming a tungsten plug which is buried in the contact hole using the same method as mentioned above, then forming an interconnection layer in contact with the tungsten plug on the third inter-layer insulating layer 35.

Next, second and third interconnection layers, not illustrated, are stacked via an inter-layer insulating layer if necessary, then an overcoat film is formed and a pad window is formed to complete the COB type DRAM.

According to the method of manufacturing a COB type DRAM of the first embodiment, the connecting plugs 17 to 19 are formed at one time using one photomask. Therefore, less photomasks are used and the process is simplified from the related art. That is, while five photomasks are required after the formation of the transistor to the formation of the storage node electrode in the related art, four are enough in the method of manufacture of the related art, that is, one for forming the contacts (simultaneously forming opens for the bit contact and storage node contact), one for forming the bit lines, one for exposing the top face of the bit contact, and one for forming the storage node. Further, the process can be simplified by the amount of the reduced number of stacked films.

The buried bit line can be made narrower easily under the resolution limit of photolithography, not adding photomasks. Further, the second inter-layer insulating layer can be made thinner, then the aspect ratio of contact hole can be reduced, therefore the contact holes can be shrunk more in diameter. For these reasons, the further high-integration of DRAM can be achieved.

Next, an explanation will be given of a second embodiment of the present invention.

The second embodiment further simplifies the manufacturing process of a DRAM where the buried bit line is provided in a further lower layer, namely, the upper portion of the first inter-layer insulating layer, and eliminates or simplifies the second inter-layer insulating layer.

The COB type DRAM of the present embodiment has the same plane configuration as the first embodiment, therefore the plan view shown in FIG. 26 is applied in this embodiment.

Figure 17:
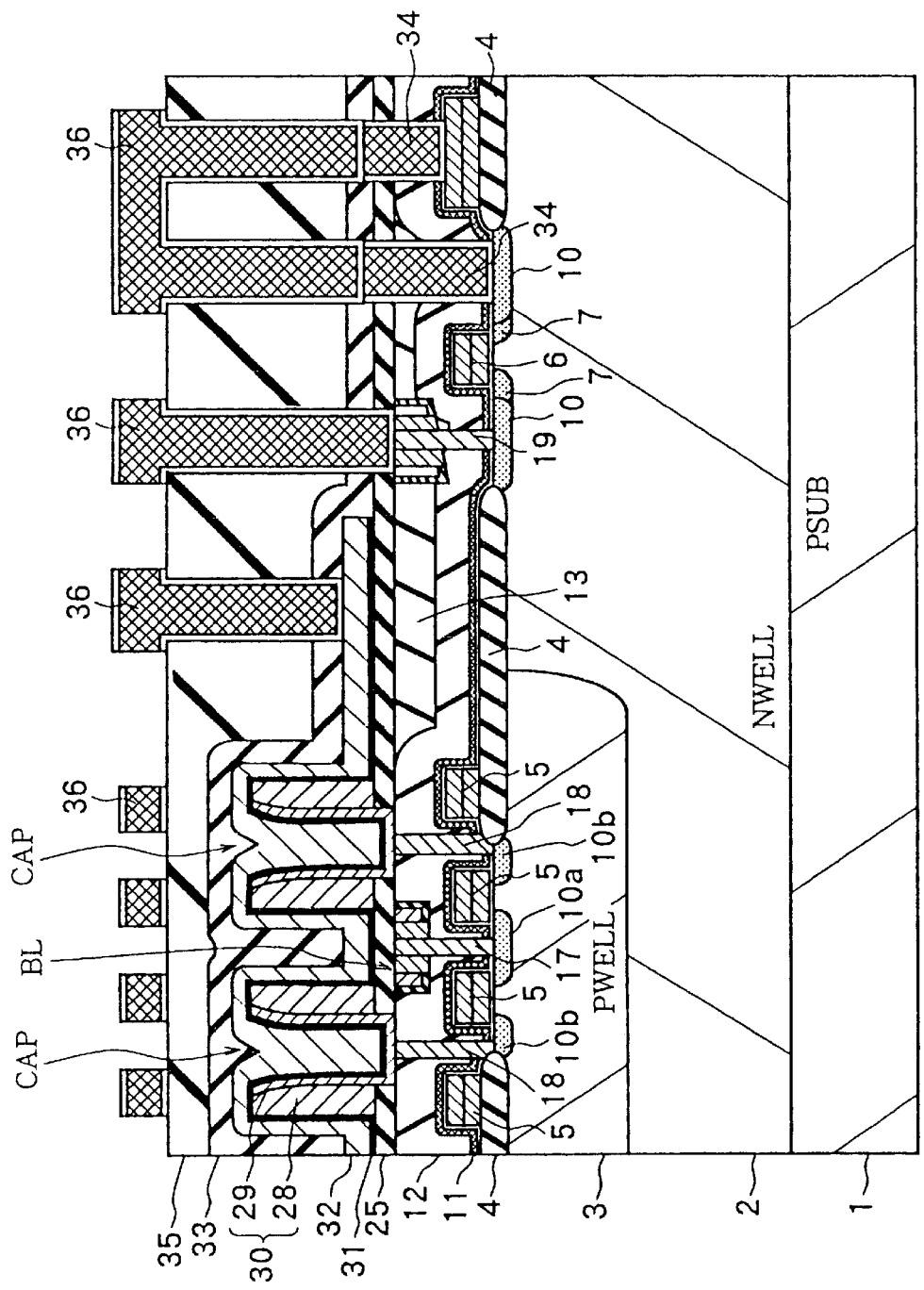
FIG. 17 is a sectional view of the configuration of a COB type DRAM according to a second embodiment of the present invention.

FIG. 17 is a sectional view of the schematic configuration of a COB type DRAM according to this embodiment.

Parts of the configuration the same as those of the first embodiment are given the same reference numerals. Explanations are therefore omitted.

In the DRAM of the present embodiment, as clear in comparison with FIG. 1, among the layers comprising the second inter-layer insulating layer in FIG. 1, the silicon nitride film 20 and the silicon oxide film 21 are eliminated. Further, the bit line BL is formed buried in an upper portion of the first inter-layer insulating layer (here, the NSG film 12). Explaining this in further detail, a groove for a bit line is formed in the top face of the NSG film 12, then the inner wall of the groove is covered by a silicon oxide film to reduce its width. Further, a first connecting plug 17 passes through about the center of the groove and extends to the same height as the top face of the NSG film 12. A doped polycrystalline silicon layer and WSix layer are provided in that order from the inside at the part of the first connecting plug 17 formed in the groove. The bit line BL is formed by these conductive layers. Note that the sectional structure shown in FIG. 17 is the slightly wide portion where bit contact BC is formed in the plan view of FIG. 26. Sectional views of the narrow portions at the left and right are not illustrated, but are comprised of a WSix layer in contact with the inner wall of the groove and a doped polycrystalline silicon layer burying the recess formed by the same. Note that the structure of the interconnections is same as that in the electrode takeout layer in contact with the upper part of the third connecting plug 19 in the peripheral circuit.

In the COB type DRAM of this embodiment, the second inter-layer insulating layer consists of only the silicon nitride film 25. Therefore the height of the capacitor is kept down by that amount, the aspect ratio of the contact holes in the peripheral circuit is small, and in turn the contact area is reduced and the structure becomes more suited to higher integration than the first embodiment.

Next, an explanation will be given of the method of manufacturing the COB type DRAM of this structure referring to FIG. 18 to FIG. 25.

The steps of manufacturing after forming the transistor on the well until forming the silicon nitride film 11, the NSG film 12, and the BPSG film 13 are similar to those of the first embodiment.

Figure 18:
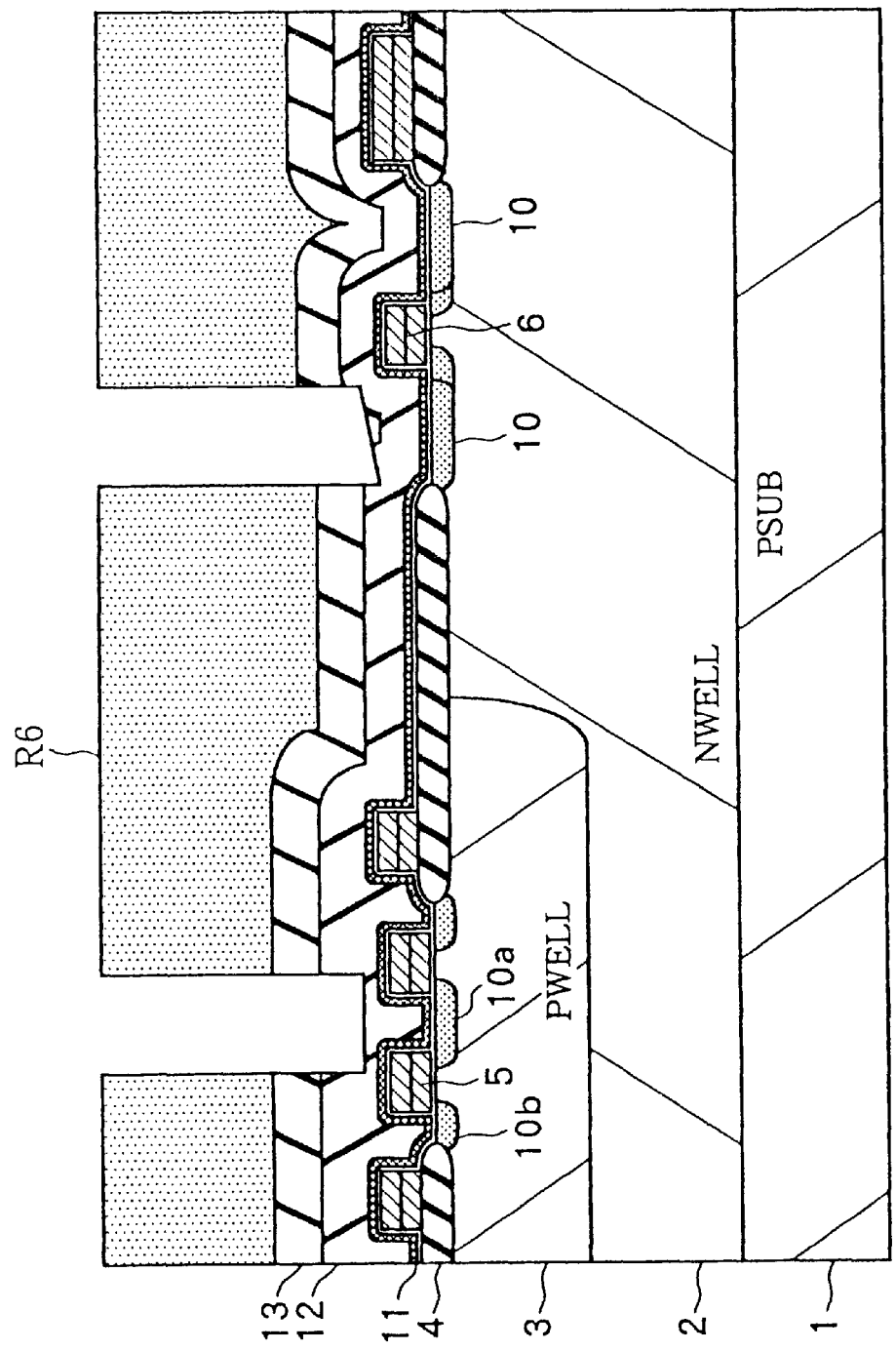
FIG. 18 to FIG. 25 are sectional views of a method of manufacturing the COB type DRAM of FIG. 17.

In the step shown in FIG. 18, the BPSG film 13 is formed with a resist pattern R6 which opens above the predetermined impurity region of a transistor for forming a groove for a bit line. The BPSG film 13 and the NSG film 12 are etched using the resist pattern R6 as a mask to form a groove for forming the bit line. In the peripheral circuit, a groove for the electrode takeout layer is formed in the peripheral circuit. This etching is stopped in the middle of the NSG film 12. Even when excessively etched, protection is accorded by the silicon nitride film 11 functioning as an etching stopper and the gate electrode of the transistor is not exposed.

Figure 19:
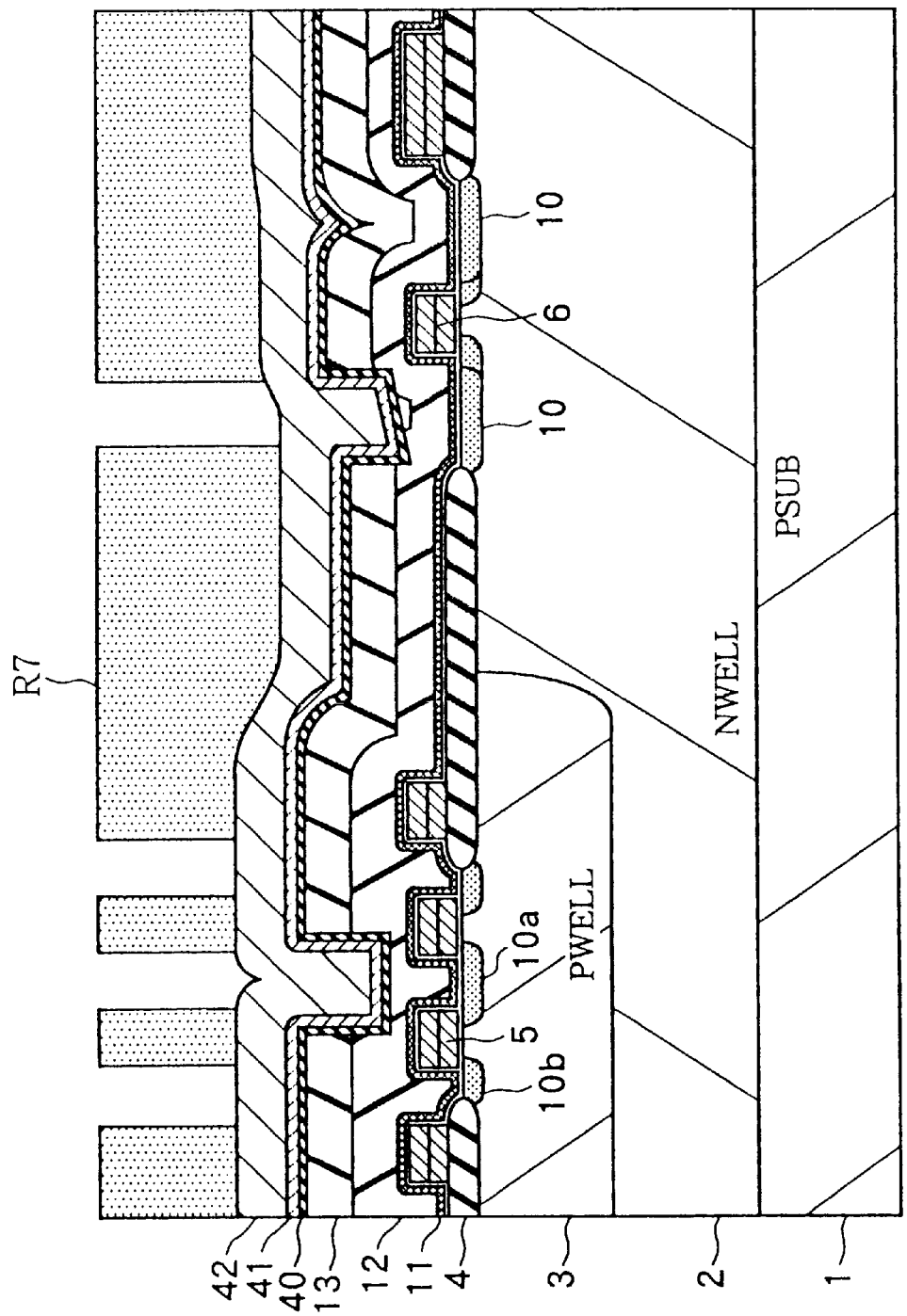

In the step shown in FIG. 19, a silicon oxide film 40 and the WSix film 41 are formed in that order to a thickness of tens of nanometers to cover the inner face of the bit line groove. Then, a doped polycrystalline silicon film 42 is formed to a thickness of hundreds of nanometers to bury the bit line groove. Note that, before forming the WSix film 41, a thin polycrystalline silicon film may be formed to a thickness of tens of nanometers so as to insure the adhesion with the underlying NSG film. Then, a resist pattern R7 is formed on the doped polycrystalline silicon film 42. The resist pattern R7 opens above the bit line groove, the node contact portion, and a groove of the electrode takeout layer of the peripheral circuit.

Figure 20:
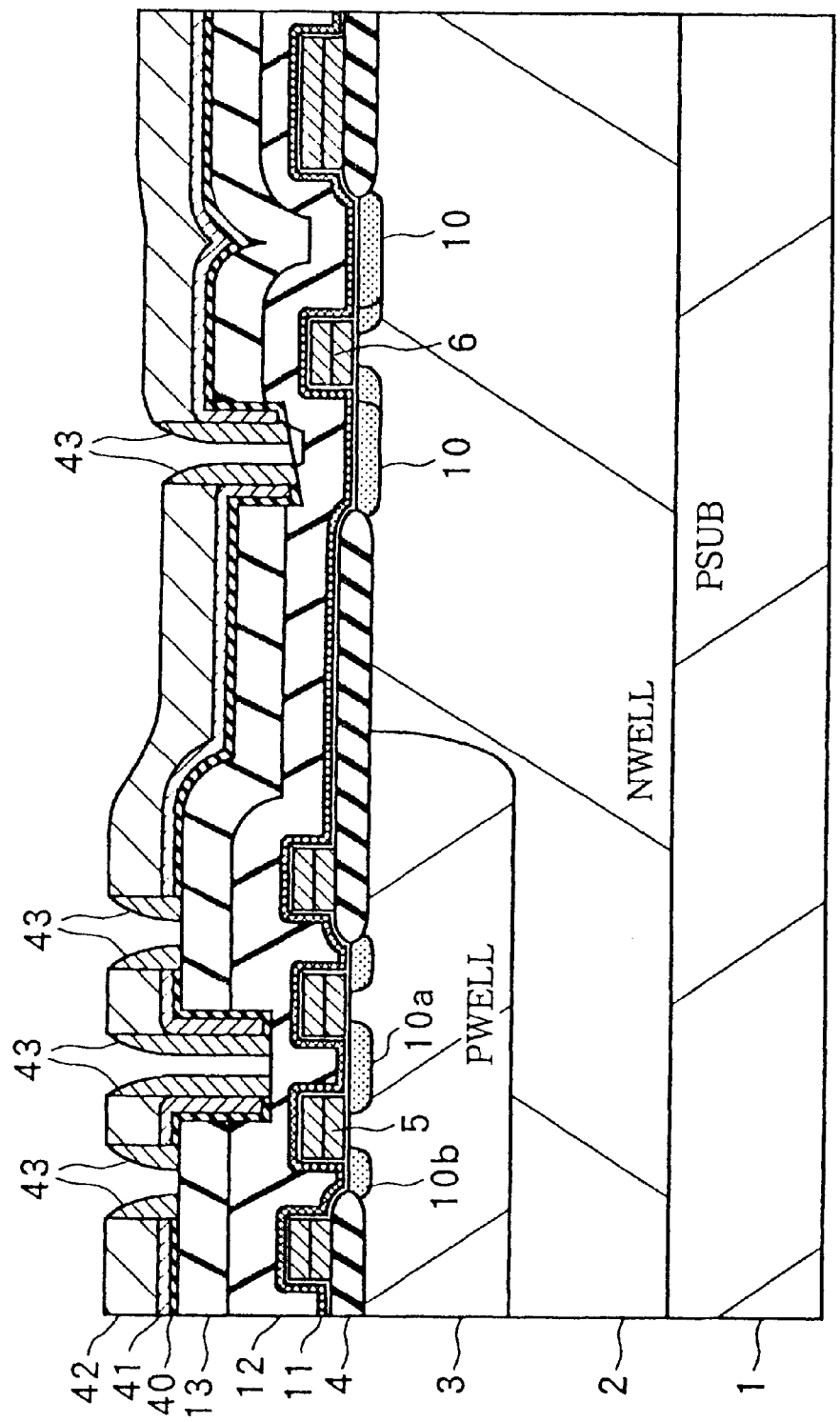

As shown in FIG. 20, the doped polycrystalline silicon film 42, the WSix film 41, and the silicon nitride film 40 are etched using the resist pattern R7 as a mask in order to form preparatory contact holes. By forming the preparatory contact holes, the NSG film 12 is partly exposed at the bottom face of the bit line groove. The resist pattern R7 is removed, then a doped polycrystalline silicon layer is formed and anisotropically etched. By this, a conductive side wall 43 is formed provided at the inner walls of the preparatory contact holes to reduce the diameters thereof. Especially, a conductive side wall 43 is formed in the bit line groove as a component of the bit line.

Figure 21:
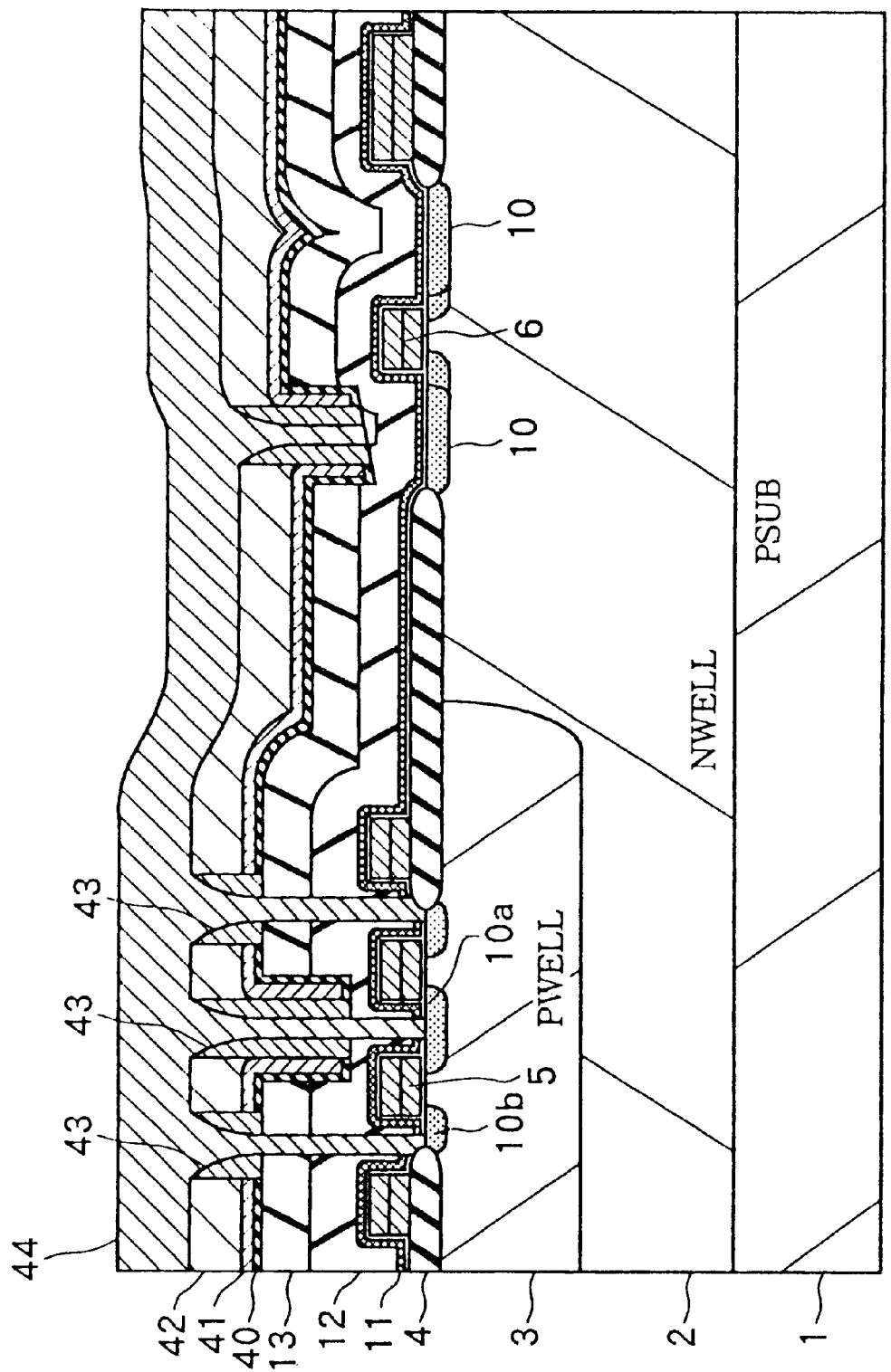

Next, shown in FIG. 21, the NSG film 12 exposed in the bit line groove, the BPSG film 13 exposed in the preparatory contact hole for node contact, and the underlying NSG film 12 are etched using the conductive side wall 43 and the doped polycrystalline silicon film 42 as masks. By this, a bit contact hole which reaches the impurity region 10*a* formed in the p-type well 3, a node contact hole which reaches the other impurity region 1*ob*, and a contact hole which reaches an impurity region 10 formed in the peripheral circuit are simultaneously formed. In this state, a doped polycrystalline silicon film 44 is formed to a thickness of tens of nanometers to hundreds of nanometers so as to bury the various reduced size contact holes by a conductive material.

Figure 22:
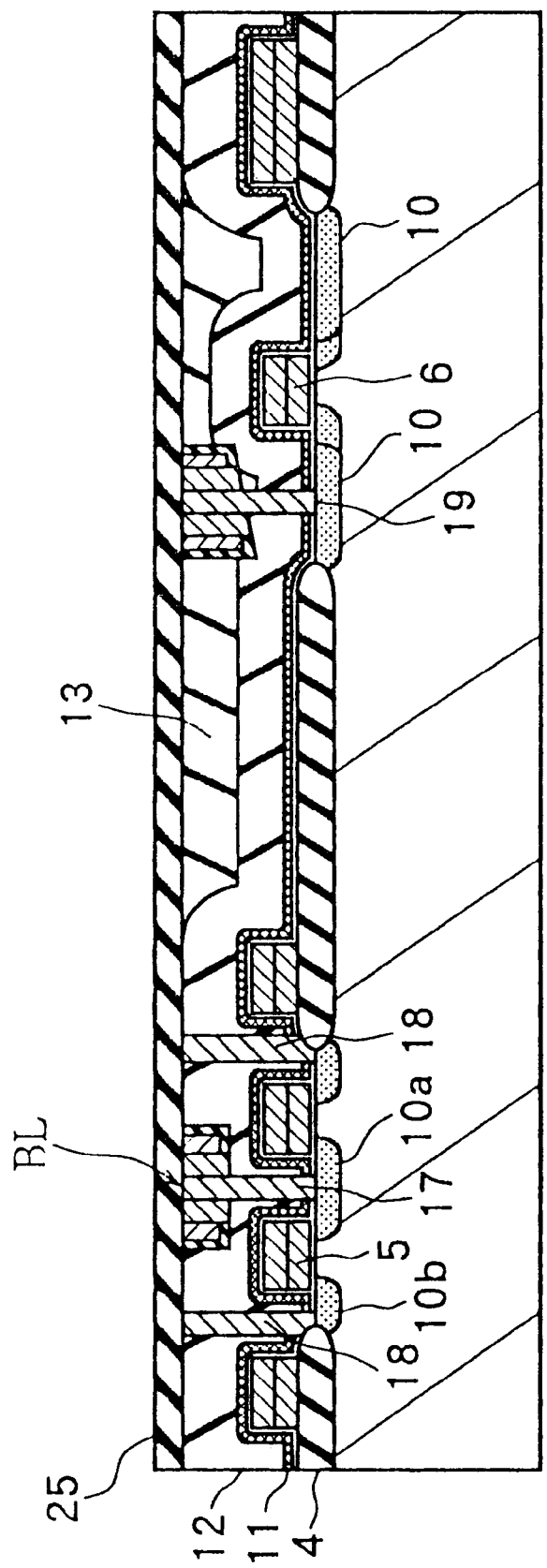

In the step shown in FIG. 22, the doped polycrystalline silicon layers 44, 42, and 43 and the WSix film 41 are shaved by etching or CMP. Further, the silicon oxide film 40 and the BPSG film 13 are shaved by CMP. This flattening is stopped, for example, when the surface of the NSG film 12 is slightly shaved. By this, a first connecting plug 17 buried in the bit contact hole and having the bit line BL around the upper portion thereof, a second connecting plug 18 buried in the node contact hole, and a third connecting plug 19 buried in the contact hole of the peripheral circuit are formed separately from each other.

On the flattened surface where the plugs are exposed, a LP-SiN film 25 for example is formed by CVD to a thickness of tens of nanometers to a 100-odd nanometers as the second inter-layer insulating layer.

Figure 23:
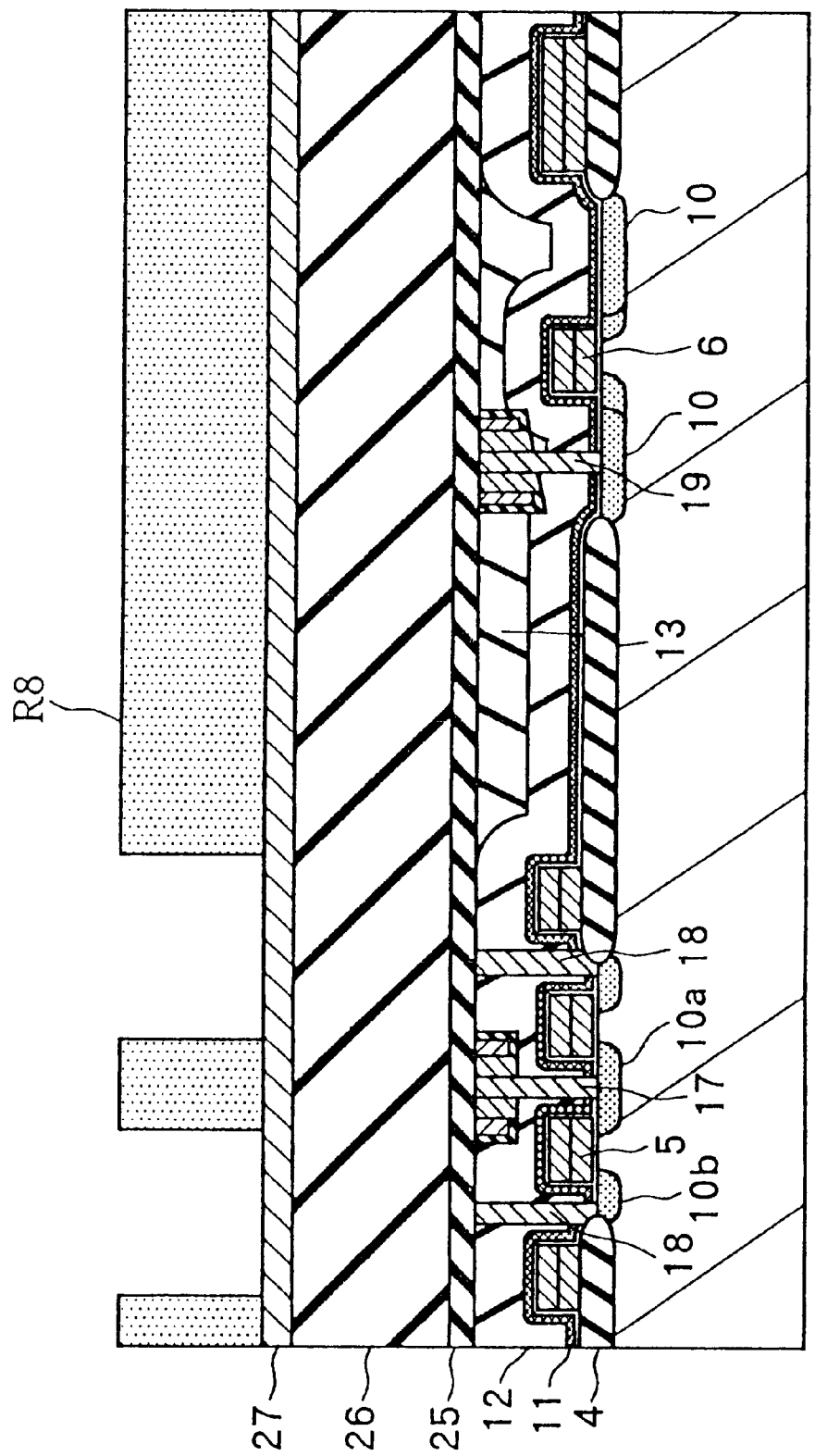
Figure 24:
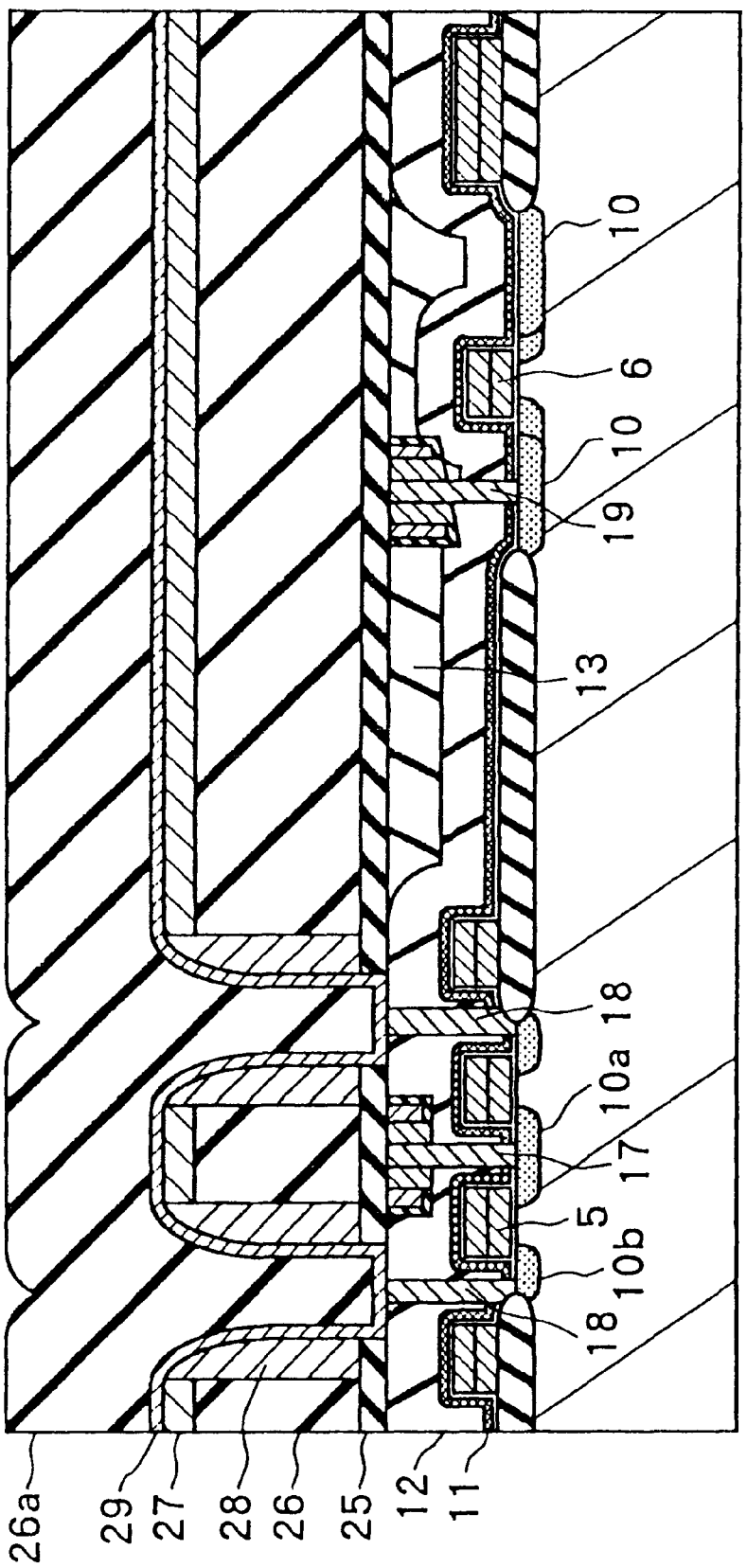
Figure 25:
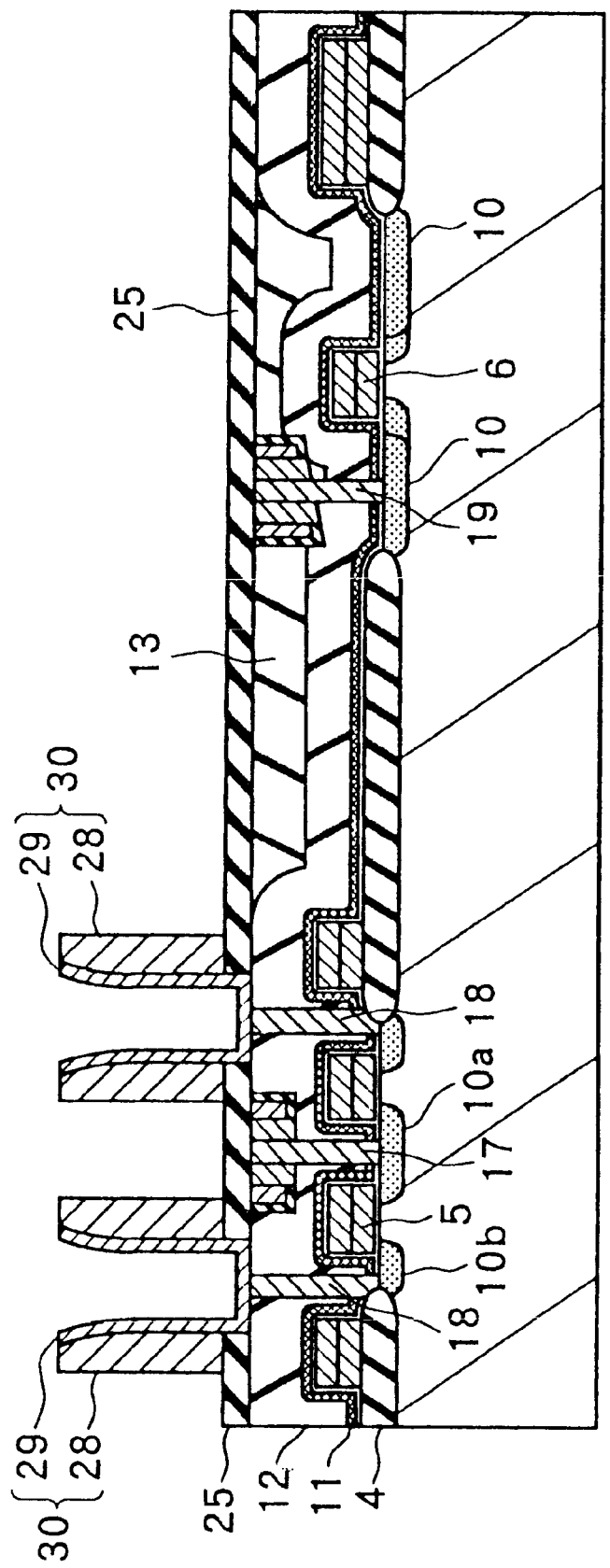

Next, the storage node electrode is formed by steps almost the same as those of the first embodiment. Namely, first, the silicon oxide film 26 and the polycrystalline silicon film 27 are deposited over the entire surface, then a resist pattern R3 for the storage node electrode is formed (FIG. 23). Next, the underlying layers 27 and 26 are etched in that order using the resist pattern R3 as a mask, then the conductive side walls comprised of the doped polycrystalline silicon layer are formed. Using the side walls as masks, the underlying silicon nitride film 25 is etched to expose the end face of the second contacting plug for node contact, then the doped polycrystalline silicon film 29 and the silicon oxide film 26a are formed over the entire surface (FIG. 24). The silicon oxide film 26a is etched back to leave part inside the storage node electrode, then the exposed upper portion of the doped polycrystalline silicon film 29, the exposed polycrystalline silicon film 27, and the upper portion of the side walls 28 are shaved by etching. Then, the silicon oxide films 26 and 26a are selectively removed by wet etching, whereby a storage node electrode 30 is formed for every capacitor (FIG. 25)

After this, in the same way as in the first embodiment, the capacitor is completed. Next, the steps of forming a third inter-layer insulating film, forming contact holes, burying the tungsten plugs, and forming the interconnection layer are carried out in that order. Finally, the overcoat film is formed and pad windows are formed to complete the COB type DRAM.

According to the method of manufacturing a COB type DRAM of the second embodiment explained above, in the same way as in the first embodiment, the connecting plugs 17 to 19 are formed simultaneously using one photomask, therefore the number of photomasks is smaller and the processing is simplified compared with the related art. Further, the structure of the second inter-layer insulating layer is simple, therefore the process is shorter by the amount of the reduced number of stacked films. Further, only four photomasks are used after the step of forming the transistor to the step of forming the storage node electrode.

Further, the effects of use of a buried type bit line, namely, the ability to reduce the width of the bit line to under the limit of resolution of photolithography without adding photomasks and, as mentioned before, the ability to eliminate or make the second inter-layer insulating layer thinner and reduce the aspect ratio of the contact holes, can be obtained, therefore the contact holes can be further reduced in diameter. For these reasons, further higher integration of the DRAM can be achieved.

What is claimed is:
1. A semiconductor device, comprising:
   a bit line connected to a transistor formed on a semiconductor layer and an electrode of a storage node of a capacitor are stacked above said transistor via an inter-layer insulating layer,
   a first connecting plug for bit contact and a second connecting plug for storage node contact buried in a first inter-layer insulating layer covering said transistor and projecting from said transistor,
   said bit line being buried in a second inter-layer insulating layer formed on said first inter-layer insulating layer and connected on said first connecting plug, and
   said electrode of the storage node being partially buried in said second inter-layer insulating layer, connected on said second connecting plug, and projecting above said second inter-layer insulating layer, wherein:
      a groove for a storage node is formed in said second inter-layer insulating layer and opens over said second connecting plug, and
   said electrode of the storage node comprises:
      a conductive side wall surrounding said groove for the storage node, projecting from said second inter-layer insulating layer, and shaped like a frame when viewed from the top, and
      a conductive layer extending from the inner face of said conductive said wall to the inside of said groove for the storage node and electrically connecting said conductive side wall with said second connecting plug.
2. A semiconductor device, comprising:
   a bit line connected to a transistor formed on a semiconductor layer and an electrode of a storage node of a capacitor are stacked above said transistor via an inter-layer insulating layer,
   a first connecting plug for bit contact and a second connecting plug for storage node contact buried in a first inter-layer insulating layer covering said transistor and projecting from said transistor,
   said bit line being buried in a second inter-layer insulating layer formed on said first inter-layer insulating layer and connected on said first connecting plug, and
   said electrode of the storage node being partially buried in said second inter-layer insulating layer, connected on said second connecting plug, and projecting above said second inter-layer insulating layer, wherein a bit line groove of said second inter-layer insulating layer in which said bit line is buried is reduced in width by an insulating side wall.
3. A semiconductor device, comprising:
   a bit line connected to a transistor formed on a semiconductor layer and an electrode of a storage node of a capacitor are stacked above said transistor via an inter-layer insulating layer,
   a first connecting plug for bit contact and a second connecting plug for storage node contact buried in a first inter-layer insulating layer covering said transistor and projecting from said transistor,
   said bit line being buried in a second inter-layer insulating layer formed on said first inter-layer insulating layer and connected on said first connecting plug, and
   said electrode of the storage node being partially buried in said second inter-layer insulating layer, connected on said second connecting plug, and projecting above said second inter-layer insulating layer, wherein said bit line comprises:

a metal silicide film in contact with an inner face of a groove formed in said second inter-layer insulating layer, and a conductive silicon layer filled in a recess formed by said metal silicide film.

4. A semiconductor device according to claim 1, wherein said second inter-layer insulating layer comprises:

a lower film wherein said bit line is buried by said lower film; and an upper film having an etching rate lower than said lower film.

5. A semiconductor device wherein a bit line connecting to a transistor formed on a semiconductor layer and an electrode of a storage node of a capacitor are stacked above said transistor via an inter-layer insulating layer, comprising;

a first connecting plug for bit contact and a second connecting plug for storage node contact buried in a first inter-layer insulating layer covering said transistor and projecting from said transistor, said bit line comprising:

a first connecting plug in a bit line groove formed in a surface of said inter-layer insulating layer and a conductive layer filled in a space surrounding said first connecting plug part in said bit line groove, wherein said conductive layer comprises:

a metal silicide film in contact with an inner face of said bit line groove, and a conductive silicon layer located between said metal silicide film and said first connecting plug.

6. A semiconductor device wherein a bit line connecting to a transistor formed on a semiconductor layer and an electrode of a storage node of a capacitor are stacked above said transistor via an inter-layer insulating layer, comprising;

a first connecting plug for bit contact and a second connecting plug for storage node contact buried in a first inter-layer insulating layer covering said transistor and projecting from said transistor, said bit line comprising:

a first connecting plug in a bit line groove formed in a surface of said inter-layer insulating layer and a conductive layer filled in a space surrounding said first connecting plug part in said bit line groove, wherein said inter-layer insulating layer comprises:

an upper film wherein said bit line buried by said upper film, and a lower film having an etching rate lower than said upper film.

7. A semiconductor device, comprising:

a bit line connected to a transistor formed on a semiconductor layer and an electrode of a storage node of a capacitor are stacked above said transistor via an inter-layer insulating layer, a first connecting plug for bit contact and a second connecting plug for storage node contact buried in a first inter-layer insulating layer covering said transistor and projecting from said transistor, said bit line being buried in a second inter-layer insulating layer formed on said first inter-layer insulating layer and connected on said first connecting plug, and said electrode of the storage node being partially buried in said second inter-layer insulating layer, connected on said second connecting plug, and projecting above said second inter-layer insulating layer, wherein said first connecting plug for bit contact projects from one impurity region of a source region or drain region of the transistor, while a second connecting plug for storage node contact projects from another impurity region, wherein the one and the another impurity regions penetrate through the first inter-layer insulating film.

8. A semiconductor device, comprising:

a bit line connected to a transistor formed on a semiconductor layer and an electrode of a storage node of a capacitor are stacked above said transistor via an inter-layer insulating layer, a first connecting plug for bit contact and a second connecting plug for storage node contact buried in a first inter-layer insulating layer covering said transistor and projecting from said transistor, said bit line being buried in a second inter-layer insulating layer formed on said first inter-layer insulating layer and connected on said first connecting plug, and said electrode of the storage node being partially buried in said second inter-layer insulating layer, connected on said second connecting plug, and projecting above said second inter-layer insulating layer, wherein said bit line lies buried in a groove in the second inter-layer insulating layer.

9. A semiconductor device according to claim 8, wherein said groove is reduced in width by insulating side walls and inner side faces thereof.

10. A semiconductor device according to claim 9 wherein the bit line is made of a metal silicide in contact with the inner side faces of the groove.

* * * * *